United States Patent
Seong et al.

(10) Patent No.: US 10,727,409 B2
(45) Date of Patent: Jul. 28, 2020

(54) METAL PLATE FOR DEPOSITION MASK, AND DEPOSITION MASK AND MANUFACTURING METHOD THEREFOR

(71) Applicant: LG INNOTEK CO., LTD., Seoul (KR)

(72) Inventors: Dong Mug Seong, Seoul (KR); Jong Min Yun, Seoul (KR); Su Hyeon Cho, Seoul (KR); Hae Sik Kim, Seoul (KR); Tae Hoon Han, Seoul (KR); Hyo Won Son, Seoul (KR); Sang Yu Lee, Seoul (KR); Sang Beum Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/332,910

(22) PCT Filed: Aug. 22, 2017

(86) PCT No.: PCT/KR2017/009110
§ 371 (c)(1),
(2) Date: Mar. 13, 2019

(87) PCT Pub. No.: WO2018/052197
PCT Pub. Date: Mar. 22, 2018

(65) Prior Publication Data
US 2019/0259951 A1     Aug. 22, 2019

(30) Foreign Application Priority Data

Sep. 13, 2016 (KR) .......... 10-2016-0118389
Feb. 1, 2017 (KR) .......... 10-2017-0014643

(51) Int. Cl.
*B32B 15/00* (2006.01)
*H01L 51/00* (2006.01)
(Continued)

(52) U.S. Cl.
CPC .......... *H01L 51/0011* (2013.01); *C23C 14/04* (2013.01); *C23C 14/042* (2013.01);
(Continued)

(58) Field of Classification Search
None
See application file for complete search history.

(56) References Cited

U.S. PATENT DOCUMENTS

| | | | |
|---|---|---|---|
| 4,775,599 A * | 10/1988 | Matsuoka | B21B 1/227 428/600 |
| 2003/0006685 A1* | 1/2003 | Matsudate | C22C 38/08 313/402 |

(Continued)

FOREIGN PATENT DOCUMENTS

| | | |
|---|---|---|
| EP | 3419074 | 12/2018 |
| JP | 2001-1237072 | 8/2001 |

(Continued)

OTHER PUBLICATIONS

International Search Report (with English Translation) and Written Opinion dated Dec. 11, 2017 issued in Application No. PCT/KR2017/009110.

(Continued)

*Primary Examiner* — Seth Dumbris
(74) *Attorney, Agent, or Firm* — KED & Associates LLP

(57) ABSTRACT

A metal plate to be used in the manufacture of a deposition mask comprises: a base metal plate; and a surface layer disposed on the base metal plate, wherein the surface layer includes elements different from those of the base metal plate, or has a composition ratio different from that of the base metal plate, and an etching rate of the base metal plate is greater than the etching rate of the surface layer. An embodiment includes a manufacturing method for a deposition mask having an etching factor greater than or equal to 2.5. The deposition mask of the embodiment includes a deposition pattern region and a non-deposition region, the deposition pattern region includes a plurality of through-holes, the deposition pattern region is divided into an effective region, a peripheral region, and a non-effective region, and through-holes can be formed in the effective region and the peripheral region.

16 Claims, 14 Drawing Sheets

(51) Int. Cl.
    *C23C 14/04*     (2006.01)
    *C23F 1/02*     (2006.01)
    *H01L 21/027*     (2006.01)
    *H01L 21/203*     (2006.01)
    *H01L 51/56*     (2006.01)
    *H01L 21/475*     (2006.01)
    *C23F 1/28*     (2006.01)

(52) U.S. Cl.
    CPC .............. *C23F 1/02* (2013.01); *H01L 21/027* (2013.01); *H01L 21/203* (2013.01); *H01L 21/475* (2013.01); *H01L 51/00* (2013.01); *H01L 51/56* (2013.01); *C23F 1/28* (2013.01); *Y10T 428/12854* (2015.01); *Y10T 428/24917* (2015.01)

(56) References Cited

U.S. PATENT DOCUMENTS

| 2006/0087226 | A1 | 4/2006 | Miura et al. |
| 2013/0064969 | A1 | 3/2013 | Inoue et al. |
| 2013/0133573 | A1 | 5/2013 | Joo et al. |
| 2013/0252022 | A1* | 9/2013 | Bullard ................ B32B 15/011 428/685 |
| 2013/0337588 | A1 | 12/2013 | Lee et al. |
| 2014/0150721 | A1 | 6/2014 | Oh et al. |
| 2015/0059643 | A1 | 3/2015 | Du et al. |
| 2016/0005970 | A1 | 1/2016 | Kwen et al. |

FOREIGN PATENT DOCUMENTS

| JP | 2004-247058 | 9/2004 |
| JP | 2016-113668 | 6/2016 |
| JP | 2016-121376 | 7/2016 |
| KR | 10-0766902 | 10/2007 |
| KR | 10-2009-0021094 | 2/2009 |
| KR | 10-2009-0065825 | 6/2009 |
| KR | 10-2010-0002067 | 1/2010 |
| KR | 10-2013-0057794 | 6/2013 |
| KR | 10-2013-0139615 | 12/2013 |
| KR | 10-2014-0070255 | 6/2014 |
| KR | 10-2016-0005272 | 1/2016 |
| KR | 10-2017-0096373 | 8/2017 |
| KR | 10-2017-0096882 | 8/2017 |
| WO | WO 2017/142231 | 8/2017 |

OTHER PUBLICATIONS

Extended European Search Report dated Apr. 15, 2020 issued in Application 17851073.1.

* cited by examiner

METAL PLATE FOR DEPOSITION MASK, AND DEPOSITION MASK AND MANUFACTURING METHOD THEREFOR

CROSS-REFERENCE TO RELATED PATENT APPLICATIONS

This application is a U.S. National Stage Application under 35 U.S.C. § 371 of PCT Application No. PCT/KR2017/009110, filed Aug. 22, 2017, which claims priority to Korean Patent Application No. 10-2016-0118389, filed Sep. 13, 2016 and Korean Patent Application No. 10-2017-0014643, filed Feb. 1, 2017, whose entire disclosures are hereby incorporated by reference.

TECHNICAL FIELD

An embodiment relates to a metal plate. Specifically, an embodiment relates to a metal plate capable of being used for a deposition mask. More specifically, an organic light emitting diode (OLED) panel may be manufactured by using the deposition mask according to an embodiment.

BACKGROUND ART

As a display device having high definition and low power consumption is required, various display devices such as a liquid crystal display device and an electroluminescent display device have been developed.

The electroluminescent display device has been spotlighted as a next generation display device due to excellent characteristics such as low light emission, low power consumption, and high definition, and the like, as compared with the liquid crystal display device.

There are an organic light emitting display device and an inorganic light emitting display device in an electric field display device. That is, an electric field display device may be classified into the organic light emitting display device and the inorganic light emitting display device according to a material of a light emitting layer.

Of these, the organic light emitting display device has received attention because the organic light emitting display device has a wide viewing angle, has a fast response speed, and is required to have low power consumption.

An organic material constituting such a light emitting layer may be formed to have a pattern for forming a pixel on a substrate by a fine metal mask method.

At this point, the fine metal mask, that is, a mask for deposition may have a through-hole corresponding to the pattern to be formed on the substrate, and, patterns of red (R), green (G), and blue (B) forming a pixel may be formed by depositing the organic material after the fine metal mask is aligned on the substrate.

Recently, a display device with ultra high definition (UHD) is required in various electronic devices such as virtual reality (VR) devices. Accordingly, a fine metal mask having fine sized through-holes capable of forming a pattern of UHD class is required.

A plurality of through-holes may be formed at a metal plate capable of being used as a deposition mask by an etching process.

At this point, when the plurality of through-holes are not uniform, uniformity of the deposition may be deteriorated, and as deposition efficiency of a pattern which is formed by the same, may be deteriorated, process efficiency may be deteriorated Meanwhile, it is difficult to uniformly form a fine sized through-hole capable of forming a pattern of HD or UHD class.

Alternatively, even though a fine sized through-hole is formed, adjacent through-holes are connected to each other, so that a deposition failure may be generated.

Accordingly, a newly structured substrate for deposition mask, a deposition mask and a manufacturing method thereof are required.

DISCLOSURE

Technical Problem

An embodiment is directed to providing a deposition mask having uniform through-holes.

An embodiment is directed to providing a deposition mask having uniform and fine through-holes.

Technical Solution

A metal plate used for manufacturing a deposition mask includes: a base metal plate; a first surface layer disposed on a first surface of the base metal plate; and a second surface layer disposed on a second surface facing the first surface of the base metal plate, wherein the first surface layer and the second surface layer include elements different from that of the base metal plate or composition ratios different from that of the base metal plate, and an etch rate of the base metal plate is greater than those of the first surface layer and the second surface layer.

A manufacturing method of a deposition mask according to an embodiment includes: preparing a base metal plate; disposing a first surface layer on a first surface of the base metal plate; disposing a second surface layer on a second surface of the base metal plate; forming a photoresist layer to dispose a first photoresist layer on the first surface layer and a second photoresist layer on the second surface layer; and etching to form a through-hole through which a first surface hole of the first surface and a second surface hole of the second surface communicate with each other, wherein the etching step has an etching factor of 2.5 or more of at least one surface hole of the first surface hole and the second surface hole, the etching factor being calculated by Equation 1 below.

$$\text{Etching Factor} = B/A \qquad \text{Equation 1}$$

In the equation, the B is a depth of one surface hole of the first surface hole and the second surface hole etched, and the A refers to a width of a photoresist layer extending from a bridge region on the one surface hole and protruding in a center direction of the one surface hole.

A deposition mask according to an embodiment includes a metal plate for a deposition mask including: a base metal plate including first and second surfaces facing each other; a first surface layer on the first surface; and a second surface layer on the second surface, wherein the metal plate for the deposition mask includes a deposition pattern region and a non-deposition region, the deposition pattern region includes a plurality of through-holes, and the deposition pattern region is divided into an effective region, an outer region, and an ineffective region, and through-holes may be formed in the effective region and the outer region.

Advantageous Effects

A metal plate according to an embodiment may include a base metal plate and a surface layer disposed on the base metal plate.

The surface layer is disposed on a first surface of the base metal plate and a second surface facing the first surface, respectively, so that an etch rate on the first surface and the second surface of the base metal plate may be delayed. Accordingly, the metal plate including the surface layer may form uniform through-holes. That is, the metal plate used for manufacturing a deposition mask includes the through-holes with improved uniformity, so that the uniformity of a pattern formed via the through-holes may be improved and process efficiency may be improved by increasing deposition efficiency of the pattern.

Therefore, an OLED panel manufactured by using the deposition mask according to the embodiment has excellent deposition efficiency of the pattern and deposition uniformity may be improved.

MODES OF THE INVENTION

Hereinafter, embodiments will be described in detail with reference to the accompanying drawings.

In describing with reference to the accompanying drawings, like drawing numerals are used to designate identical elements, and redundant description thereof will be omitted.

Although terms such as "first", "second", etc. may be used to describe elements, the above-described elements should not be limited by the above terms, and are only used to distinguish one element from another.

Also, when a part is referred to as "including" an element, it means that the part may include other elements as well without excluding the other elements unless specifically stated otherwise.

A process for depositing an organic material on a substrate will be described with reference to FIGS. 1 to 3.

Figure 1:
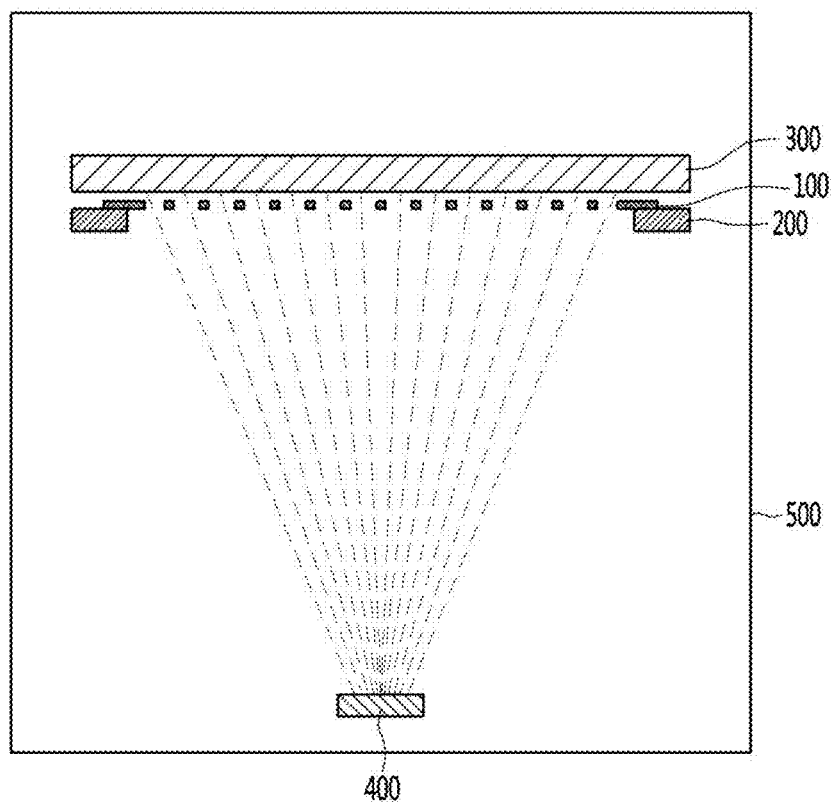
FIGS. 1 to 3 are conceptual diagrams for explaining a process of depositing an organic material on a substrate.

FIG. 1 is a view illustrating an organic material deposition apparatus in which a deposition mask 100 according to an embodiment is included.

The organic material deposition apparatus may include a deposition mask 100, a mask frame 200, a substrate 300, an organic material deposition container 400, and a vacuum chamber 500.

The deposition mask 100 may include a plurality of through-holes TH. The deposition mask 100 may be a substrate for deposition mask including a plurality of through-holes TH. At this point, the through-holes may be formed to correspond to patterns to be formed on the substrate.

The mask frame 200 may include an opening. The plurality of through-holes of the deposition mask 100 may be disposed on a region corresponding to the opening. Accordingly, organic material supplied to the organic material deposition container 400 may be deposited on the substrate 300. The deposition mask may be disposed and fixed on the mask frame 200. For example, the deposition mask may be tensioned and fixed on the mask frame 200 by welding.

Figure 2:
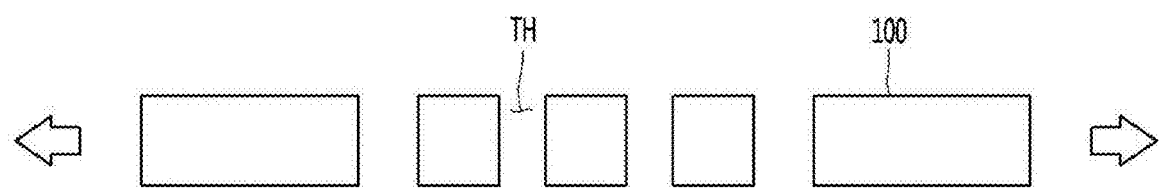

Referring to FIGS. 1 and 2, the deposition mask 100 may be pulled in opposite directions at an end disposed on the outermost portion of the deposition mask 100. In the deposition mask 100, one end of the deposition mask 100 and the other end opposite to the one end may be pulled in opposite directions in a longitudinal direction of the deposition mask 100. The one end and the other end of the deposition mask 100 may face each other and be disposed in parallel. The one end of the deposition mask 100 may be one of end portions forming four side surfaces disposed on the outermost portion of the deposition mask 100. For example, the deposition mask 100 may be pulled at a force of 0.4 to 1.5 kgf. Accordingly, the tensioned deposition mask 100 may be placed on the mask frame 200.

Next, the deposition mask 100 may be fixed to the mask frame 200 by welding a side region, that is, the end portion of the deposition mask 100. Subsequently, a portion of the deposition mask 100 disposed outside the mask frame 200 may be removed by a method such as cutting. For example, when the deposition mask 100 is deformed in the welding process and the deposition mask 100 is disposed in a region excluding fixing regions of the deposition mask 100 and the mask frame 200, a portion of the deposition mask 100 may be removed.

Figure 3:
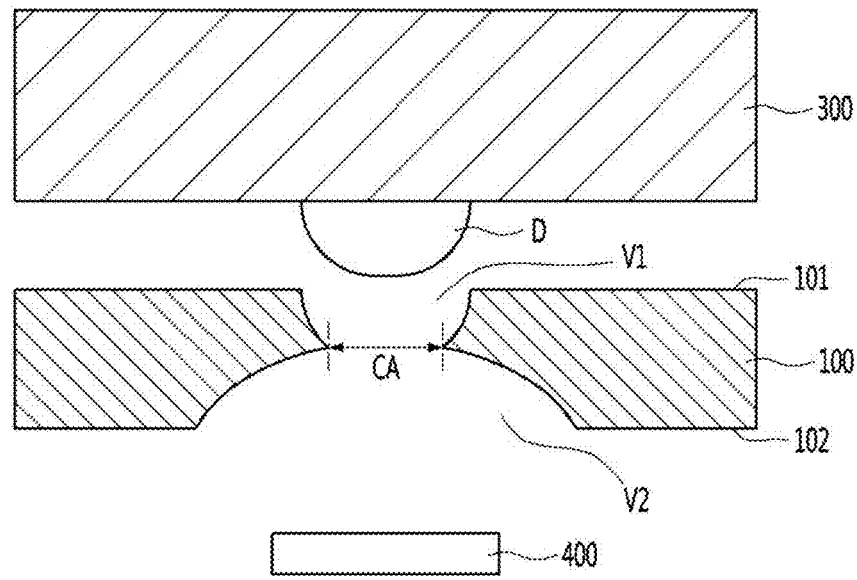

Referring to FIGS. 1 and 3, the substrate 300 may be a substrate used for manufacturing a display device. Patterns of red (R), green (G), and blue (B) may be formed on the substrate 300 to form a pixel that is three primary colors of light.

The organic material deposition container 400 may be a crucible. An organic material may be disposed at an inside of the crucible.

As a heat source and/or current is supplied to the crucible in the vacuum chamber 500, the organic material may be deposited on the substrate 300.

FIG. 3 is an enlarged view of one through-hole of the deposition mask 100.

The deposition mask 100 may include a first surface 101 and a second surface 102 facing the first surface.

The first surface 101 of the deposition mask 100 may include a first surface hole V1 and the second surface 102 of the deposition mask 100 may include a second surface hole V2.

The through-hole may be formed by a connecting part CA through which the first surface hole V1 and the second surface hole V2 communicate with each other.

A width of the second surface hole V2 may be greater than that of the first surface hole V1. At this time, the width of the first surface hole V1 may be measured at the first surface 101, and the width of the second surface hole V2 may be measured at the second surface 102.

The first surface hole V1 may be disposed toward the substrate 300. Accordingly, the first surface hole V1 may have a shape corresponding to a deposition material D, that is, a pattern.

The second surface hole V2 may be disposed toward the organic material deposition container 400. Accordingly, the second surface hole V2 may accommodate the organic material supplied from the organic material deposition container 400 in a wide width, and a fine pattern may be formed quickly on the substrate 300 through the first surface hole V1 having a width smaller than that of the second surface hole V2.

FIGS. 4 to 7 are views illustrating plan views of a substrate for a deposition mask and a deposition mask according to an embodiment.

Referring to FIGS. 4 to 7, a substrate for a deposition mask and a deposition mask according to an embodiment may include a deposition pattern region DA and a non-deposition region NDA.

The deposition pattern region DA may be a region for depositing an organic material through a deposition pattern portion.

The deposition pattern region DA may include a plurality of deposition pattern portions AA1, AA2, and AA3 included in one deposition mask.

The plurality of deposition pattern portions may include a first effective region AA1, a second effective region AA2, and a third effective region AA3. One deposition pattern portion may be any one of the first effective region AA1, the second effective region AA2, and the third effective region AA3.

In the case of a small-sized display device such as a smartphone, one deposition pattern portion included in one deposition mask may be one for forming one display device. Accordingly, one deposition mask may include a plurality of deposition pattern portions, and a plurality of display devices may be formed at the same time. Therefore, the deposition mask according to an embodiment may improve process efficiency.

Alternatively, in the case of a large-sized display device such as a television, a plurality of deposition pattern portions included in one deposition mask may be a part for forming one display device. At this time, the plurality of deposition pattern portions may be for preventing deformation due to a load of the mask.

The deposition pattern region DA may include a plurality of isolation regions IA1 and IA2 included in one deposition mask.

The isolation regions IA1 and IA2 may be disposed between adjacent deposition pattern portions. The isolation region may be a spaced region between the plurality of deposition pattern portions. For example, a first isolation region IA1 may be disposed between the first effective region AA1 and the second effective region AA2. For example, a second isolation region IA2 may be disposed between the second effective region AA2 and the third effective region AA3. The isolation region allows the adjacent deposition pattern portions to be distinguished, so that the plurality of deposition pattern portions may be supported by one deposition mask.

The deposition mask may include a non-deposition region NDA on both side portions in a longitudinal direction of the deposition pattern region DA. The deposition mask according to an embodiment may include the non-deposition region NDA on both sides in a horizontal direction of the deposition pattern region DA.

The non-deposition region NDA of the deposition mask may be a region not involved in a deposition.

The non-deposition region NDA may include frame fixing regions FA1 and FA2 for fixing to a mask frame. For example, the non-deposition region NDA of the deposition mask may include a first frame fixing region FA1 on one side of the deposition pattern region DA, and may include a second frame fixing region FA2 on the other side opposite to the one side of the deposition pattern region DA. The first frame fixing region FA1 and the second frame fixing region FA2 may be a region fixed to the mask frame by welding.

The non-deposition region NDA may include half etching portions HF1 and HF2. For example, the non-deposition region NDA of the deposition mask may include a first half etching portion HF1 on one side of the deposition pattern region DA, and may include a second half etching portion HF2 on the other side opposite to the one side of the deposition pattern region DA. The first half etching portion HF1 and the second half etching portion HF2 may be regions in which grooves are formed in a depth direction of the deposition mask. Since the first half etching portion HF1 and the second half etching portion HF2 may have grooves having a thickness of about ½ of a thickness of the deposition mask, it is possible to disperse a stress when the deposition mask is pulled.

In addition, the half etching portion may be formed simultaneously when the first surface hole or the second surface hole is formed. Through the same, process efficiency may be improved.

Further, a surface layer may be formed in the deposition pattern region DA region, the surface layer may not be formed in the non-deposition region NDA, or the surface layer may be formed on only a part of a first surface or a second surface of the substrate, or the surface layer may be formed on only a part of the first surface, so that it is possible to adjust stress dispersion by forming an etching factor of the half etching portion differently from that of a first surface hole or a second surface hole.

The half etching portion may be formed in a ineffective region UA of the deposition pattern region DA. In order to disperse the stress at the time of pulling the deposition mask, a plurality of the half etching portions may be disposed to be dispersed in all or a part of the ineffective region UA.

In addition, the half etching portion may be formed in a frame fixing region and/or a peripheral region of the frame fixing region. Accordingly, it is possible to uniformly disperse the stress of the deposition mask, which is generated when the deposition mask is fixed on the frame and/or a deposition material is deposited after fixing the deposition mask on the frame. Accordingly, it is possible to maintain the deposition mask so as to have uniform through-holes.

The frame fixing regions FA1 and FA2 for fixing on the mask frame of the non-deposition region NDA may be disposed between the half etching portions HF1 and HF2 of the non-deposition region NDA and effective regions of the deposition pattern region DA adjacent to the half etching portions HF1 and HF2. For example, the first frame fixing region FA1 may be disposed between the first half etching portion HF1 of the non-deposition region NDA and the first effective region AA1 of the deposition pattern region DA adjacent to the first half etching portion HF1. For example, the second frame fixing region FA2 may be disposed between the second half etching portion HF2 of the non-deposition region NDA and the third effective region AA3 of the deposition pattern region DA adjacent to the second half etching portion HF2. Accordingly, it is possible to simultaneously fix a plurality of deposition pattern portions.

The deposition mask may include a semicircular shaped open portion at both ends in a horizontal direction X. The non-deposition region NDA of the deposition mask may include one semicircular shaped open portion at each of both ends in the horizontal direction. For example, the non-deposition region NDA of the deposition mask may include an open portion of which a center in a vertical direction Y is opened on one side in the horizontal direction. For example, the non-deposition region NDA of the deposition mask may include the open portion of which the center in the vertical direction is opened on the other side opposite to the one side in the horizontal direction. That is, both ends of the deposition mask may include the open portion at ½ point of a length in the vertical direction. For example, both ends of the deposition mask may be shaped like a horseshoe.

The half etching portion may be formed in various shapes.

Figure 4:
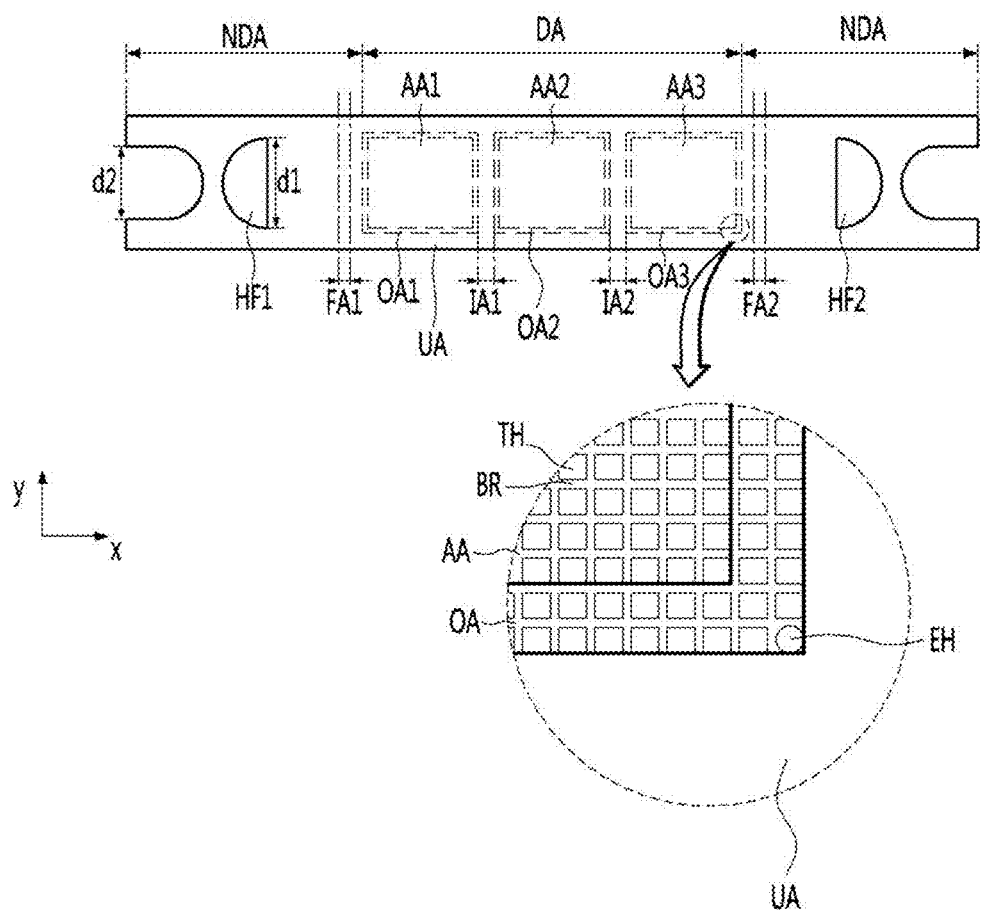
FIGS. 4 to 7 are views illustrating a plan view of a metal plate for a deposition mask and a deposition mask according to an embodiment.
Figure 5:
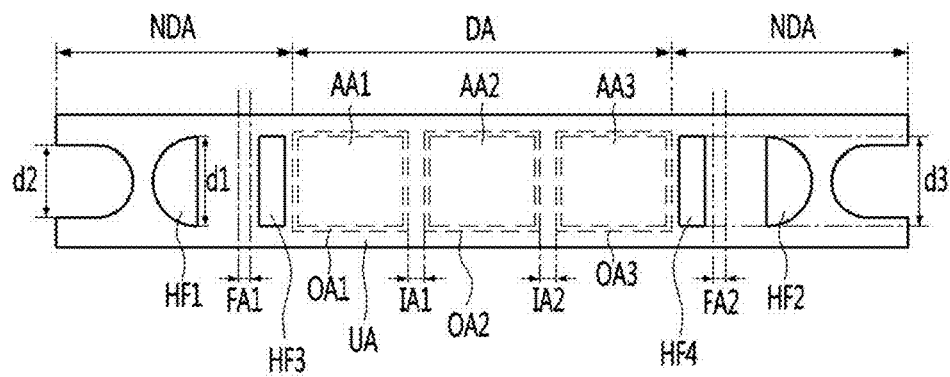
Figure 6:
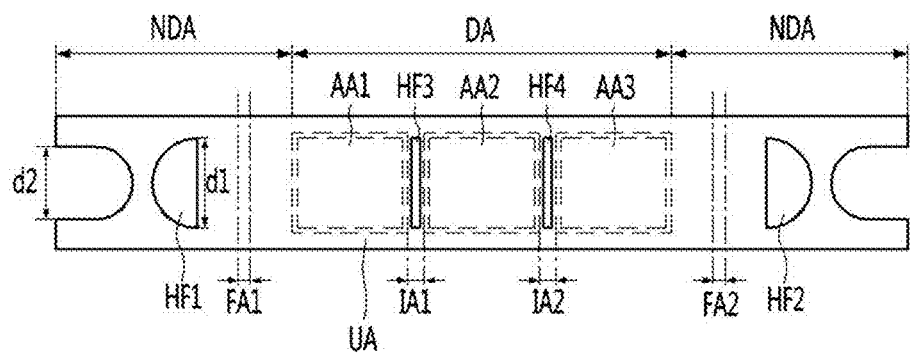

Referring to FIGS. 4 to 6, the half etching portion may include a semicircular shaped groove portion. The groove may be formed on at least one of a first surface 101 and a second surface 102 of the deposition mask. Preferably, the half etching portion may be formed on a surface corresponding to the first surface hole (a surface side to be deposited). Accordingly, the half etching portion may disperse a stress that may be generated due to a difference in size between the first surface hole and the second surface hole.

Alternatively, the half etching portion may be formed on both surfaces of the first surface and the second surface to disperse a stress of the first surface and the second surface. At this time, the half etching region of the half etching portion may be wider at a surface corresponding to the first surface hole (a surface side to be deposited). That is, the deposition mask according to an embodiment may include the half etching portion by forming grooves on the first surface and the second surface of the deposition mask, respectively. Specifically, a depth of the groove of the half etching portion formed on the first surface may be greater than a depth of the groove of the half etching portion formed on the second surface. Accordingly, the half etching portion may disperse the stress that may be generated due to the difference in size between the first surface hole and the second surface hole. Since the surface areas of the first surface and the second surface of the deposition mask may be made similar to each other by formation of the first surface hole, the second surface hole, and the half etching portion, it is possible to prevent the through-hole from being displaced.

In addition, the grooves formed on the first surface and the second surface may be formed so as to be displaced from each other. Through the same, it is possible to prevent the half etching portion from forming the through-hole.

The half etching portion may include a curved surface and a flat surface.

The flat surface of the first half etching portion HF1 may be disposed to be adjacent to the first effective region AA1, and the flat surface may be disposed horizontally at an end in a longitudinal direction of the deposition mask. The curved surface of the first half etching portion HF1 may have a convex shape toward one end in the longitudinal direction of the deposition mask. For example, the curved surface of the first half etching portion HF1 may be formed such that a ½ point of a length in a vertical direction of the deposition mask corresponds to the radius of a semicircular shape.

The flat surface of the second half etching portion HF2 may be disposed to be adjacent to the third effective region AA3, and the flat surface may be disposed horizontally at an end in the longitudinal direction of the deposition mask. The curved surface of the second half etching portion HF2 may have a convex shape toward the other end in the longitudinal direction of the deposition mask. For example, the curved surface of the second half etching portion HF2 may be formed such that a ½ point of a length in the vertical direction of the deposition mask corresponds to the radius of a semicircular shape.

Meanwhile, a curved surface of the open portion positioned at both ends of the deposition mask may be directed to the half etching portion. Accordingly, the open portion positioned at both ends of the deposition mask may have the shortest separation distance at the first or second half etching portion and a ½ point of a length in the vertical direction of the deposition mask.

Figure 7:
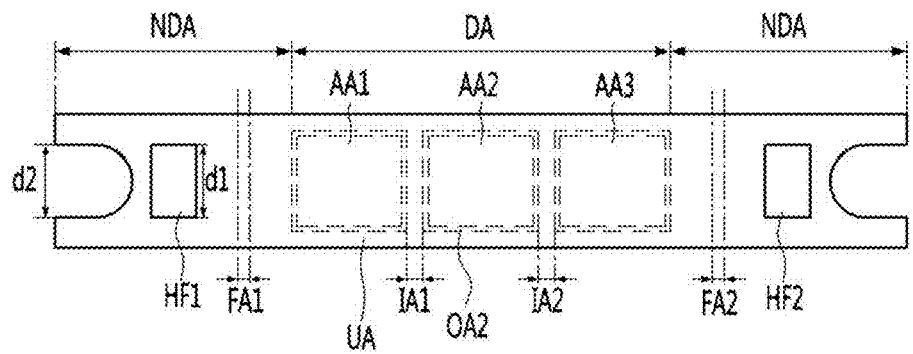

Referring to FIG. 7, the half etching portion may have a rectangular shape. The first half etching portion HF1 and the second half etching portion HF2 may have a rectangular shape or a square shape.

The deposition mask according to an embodiment may include a plurality of half etching portions. The deposition mask according to the embodiment may include a plurality of half etching portions in at least one of the deposition pattern region DA and the non-deposition region NDA. The deposition mask according to the embodiment may include a half etching portion only in the ineffective region UA. The ineffective region UA may be a region other than the effective region AA.

Referring to FIGS. 4 and 7, the deposition mask according to an embodiment may include two half etching portions. For example, the half etching portion may include an even number of half etching portions. The deposition mask according to the embodiment may be disposed only in the non-deposition region NDA.

It is preferable to form the half etching portion to be symmetric in an X-axis direction or in a Y-axis direction with respect to a center of the mask. Through the same, it possible to equalize a tensile force in both directions.

Referring to FIG. 5, the deposition mask according to an embodiment may include four half etching portions. For example, the half etching portion may include an even number of half etching portions. The deposition mask according to the embodiment may include a plurality of half etching portions only in the non-deposition region NDA.

A third half etching portion HF3 may be further included between the first half etching portion HF1 and the first effective region AA1. For example, the third half etching portion HF3 may be disposed between the first frame fixing region FA1 and the first effective region AA1.

A fourth half etching portion HF4 may be further included between the second half etching portion HF2 and the third effective region AA3. For example, the fourth half etching portion HF4 may be disposed between the second frame fixing region FA2 and the third effective region AA3.

The first half etching portion HF1 disposed at a position in the horizontal direction corresponding to each other may have a shape corresponding to that of the second half etching portion HF2. The third half etching portion HF3 disposed at a position in the horizontal direction corresponding to each other may have a shape corresponding to that of the fourth half etching portion HF4.

The first half etching portion HF1 disposed at different positions may have a shape different from that of any one of the third half etching portion HF3 and the fourth half etching portion HF4. However, the embodiment is not limited thereto, and all of the first half etching portion HF1, the second half etching portion HF2, the third half etching portion HF3 and the fourth half etching portion HF4 may have the same shape. Although four half etching portions have been described in the embodiment, the half etching portion may be formed in various shapes and in various numbers within a range formed in the ineffective region UA. That is, if the shape of the half etching portion is formed to be mutually symmetrical with respect to the center in the horizontal direction X of the deposition mask, any shape may be acceptable. In addition, the number of the half etching portions may be six or more.

The third half etching portion HF3 and the fourth half etching portion HF4 may have a square shape. For example, the third half etching portion HF3 and the fourth half etching portion HF4 may have a rectangular shape. The third half etching portion HF3 and the fourth half etching portion HF4 may have a rectangular shape extending in the vertical direction of the deposition mask. Specifically, the third half etching portion HF3 and the fourth half etching portion HF4 may have a length in the vertical direction Y longer than a length in the horizontal direction X. Accordingly, the half etching portion may effectively control a stress generated when the deposition mask is fixed to a frame.

Referring to FIG. 6, the deposition mask according to an embodiment may include four half etching portions. For example, the half etching portion may include an even number of half etching portions. The deposition mask according to the embodiment may include a plurality of half etching portions in the non-deposition region NDA and the deposition pattern region DA, respectively.

The non-deposition region NDA may include the first half etching portion HF1 and the second half etching portion HF2.

The deposition pattern region DA may include a third half etching portion HF3 and a fourth half etching portion HF4.

The third half etching portion HF3 may be disposed between the first effective region AA1 and the second effective region AA2. For example, the third half etching portion HF3 may be disposed in the first isolation region IA1.

The fourth half etching portion HF3 may be disposed between the second effective region AA2 and the third effective region AA3. For example, the fourth half etching portion HF4 may be disposed in the second isolation region IA2.

The first half etching portion HF1 disposed at a position in the horizontal direction corresponding to each other may have a shape corresponding to the second half etching portion HF2. The third half etching portion HF3 disposed at a position in the horizontal direction corresponding to each other may have a shape corresponding to the fourth half etching portion HF4.

The first half etching portion HF1 disposed at different positions may have a shape different from any one of the third half etching portion HF3 and the fourth half etching portion HF4. However, the embodiment is not limited thereto, and all of the first half etching portion HF1, the second half etching portion HF2, the third half etching portion HF3 and the fourth half etching portion HF4 may have the same shape.

The third half etching portion HF3 and the fourth half etching portion HF4 may have a quadrilateral shape. For example, the third half etching portion HF3 and the fourth half etching portion HF4 may have a rectangular shape. The third half etching portion HF3 and the fourth half etching portion HF4 may have a rectangular shape extending in the vertical direction of the deposition mask. Specifically, the third half etching portion HF3 and the fourth half etching portion HF4 may have a length in the vertical direction Y longer than the length in the horizontal direction X.

A length in a vertical direction Y of the open portion positioned at both ends of the deposition mask may correspond to the length in the vertical direction of the half etching portion or may be different from each other.

For example, referring to FIGS. 4 to 6, a length d1 in a vertical direction of a flat surface portion of the first half etching portion HF1 or the second half etching portion HF2 may be greater than a length d2 in a vertical direction of the open portion.

For example, referring to FIGS. 5 and 6, a length d3 in a vertical direction of the third half etching portion HF3 or the fourth half etching portion HF4 may be greater than the length d2 in the vertical direction of the open portion. The length d3 in the vertical direction of the third half etching portion HF3 or the fourth half etching portion HF4 may correspond to the length d1 in the vertical direction of the flat surface portion of the first half etching portion HF1 or the second half etching portion HF2.

For example, referring to FIG. 7, a length d1 in a vertical direction of the first half etching portion HF1 or the second half etching portion HF2 may correspond to the length d2 in the vertical direction of the open portion. Accordingly, when the deposition mask is pulled, a stress may be uniformly dispersed, so that the deformation (wave deformation) of the deposition mask may be reduced. Therefore, the deposition mask according to an embodiment may have uniform through-holes, so that the deposition efficiency of the pattern may be improved.

Preferably, the length d1 in the vertical direction of the first half etching portion HF1 or the second half etching portion HF2 may be 80 to 200% of the length d2 in the vertical direction of the open portion (d1:d2=0.8 to 2:1). The length d1 in the vertical direction of the first half etching portion HF1 or the second half etching portion HF2 may be 90 to 150% of the length d2 in the vertical direction of the open portion (d1:d2=0.9 to 1.5:1). The length d1 in the vertical direction of the first half etching portion HF1 or the second half etching portion HF2 may be 95 to 110% of the length d2 in the vertical direction of the open portion (d1:d2=0.95 to 1.1:1).

In addition, the length d1 in the vertical direction of the flat surface portion of the second half etching portion HF2 and the length d3 in the vertical direction of the fourth half etching portion HF4 may correspond to a length in a vertical direction of the first effective region AA1. Through the same, a tensile force may be uniformly applied to the through-hole formed in the effective region.

Preferably, the length d1 in the vertical direction of the first half etching portion HF1 or the second half etching portion HF2 may be 80 to 120% of the length in the vertical direction of the effective region.

Preferably, the length d3 in the vertical direction of the third half etching portion HF3 or the fourth half etching portion HF4 may be 80 to 120% of the length in the vertical direction of the effective region.

With reference to an enlarged view of FIG. 4, through-holes included in an effective region and an ineffective region will be described. Although enlarged views are not shown in FIGS. 5 to 7, it is obvious that the effective region and the ineffective region include through-holes.

The deposition mask may include an effective region AA and an ineffective region UA. The deposition mask 100 may include an effective region AA including a plurality of through-holes TH and a bridge region BR, and an ineffective region UA disposed at an outer periphery of the effective region.

The effective region AA may be an inner region when an outer periphery of through-holes positioned at the outermost portion for depositing an organic material among a plurality of through-holes is connected. The ineffective region UA may be an outer region when the outer periphery of the through-holes positioned at the outermost portion for depositing the organic material among the plurality of through-holes is connected.

The ineffective region UA is a region excluding the effective region of the deposition pattern region DA and the non-deposition region NDA. The ineffective region UA may include outer regions OA1, OA2, and OA3 surrounding an outer periphery of the effective regions AA1, AA2, and AA3.

The deposition mask according to an embodiment may include a plurality of outer regions OA1, OA2, and OA3 positioned on an outer periphery of a plurality of deposition pattern portions. The number of the deposition pattern portions may correspond to the number of the outer regions. That is, one deposition pattern portion may include one outer region spaced apart at a predetermined distance in the horizontal direction and the vertical direction from an end of one deposition pattern portion.

The first effective region AA1 may be included in a first outer region OA1. The first effective region AA1 may include a plurality of through-holes for forming a deposition material. The first outer region OA1 surrounding the outer periphery of the first effective region AA1 may include a plurality of through-holes. The first effective region AA1 may be in a quadrilateral shape, and the first outer region OA1 may be in a quadrilateral shape. For example, the first effective region AA1 may be in a rectangular shape, and the first outer region OA1 may be in a rectangular shape. For example, the first effective region AA1 may be in a square shape and the first outer region OA1 may be in a square shape.

The first outer region OA1 may further include two through-holes in the horizontal direction and the vertical direction, respectively, from the through-hole positioned at the outermost portion of the first effective region AA1. For example, in the first outer region OA1, two through-holes may be disposed in a row in the horizontal direction at an upper portion and a lower portion of the through-hole positioned at the outermost portion of the first effective region AA1, respectively. For example, in the first outer region OA1, two through-holes may be disposed in a row in the vertical direction at the left side and the right side of the through-hole positioned at the outermost portion of the first effective region AA1, respectively. The plurality of through-holes included in the first outer region OA1 is for reducing etching failure of the through-holes positioned at the outermost portion of the effective region. Accordingly, the deposition mask according to the embodiment may improve the uniformity of the plurality of through-holes positioned in the effective region, and may improve the quality of the deposition pattern produced through the same.

A through-hole set of the first outer region OA1 in which one through-hole positioned at an upper portion and a lower portion of the outermost portion of the first effective region AA1, respectively is disposed in a row in the horizontal direction, may be in a shape corresponding to that of the through-holes of the first effective region AA1. In addition, a through-hole set of the first outer region OA1 in which one through-hole positioned at the left side and the right side of the outermost portion of the first effective region AA1, respectively is disposed in a row in the vertical direction, may be in a shape corresponding to that of the through-holes of the first effective region AA1. Accordingly, the uniformity of the through-hole included in the first effective region AA1 may be improved.

The through-hole included in the effective region may have a shape partially corresponding to that of the through-hole included in the ineffective region. The through-hole included in the effective region may have a different shape from that of a through-hole positioned at an edge portion of the ineffective region.

Four edge holes EH positioned at an outermost corner of the first outer region OA1 may have a different shape from that of the through-hole included in the first effective region AA1.

For example, the four edge holes EH positioned at the outermost corner of the first outer region OA1 may have a circular shape. Here, the circular shape may mean a shape including a curved surface as a whole.

For example, the through-hole included in the first effective region AA1 may have a quadrilateral shape. Here, the quadrilateral shape may be a rectangular shape, and may mean a rectangular shape with rounded corners. That is, the through-hole included in the effective region AA1 may have different diameters in the horizontal direction and in the vertical direction.

The diameter of the edge hole EH may be different from any one of diameters in the horizontal direction and in the vertical direction of the through-hole included in the effective region AA1. For example, as shown in FIG. 4, the diameter of the edge hole EH may be different from the diameter in the horizontal direction of the through-hole included in the effective region AA1. The diameter of the edge hole EH may be the same as the diameter in the vertical direction of the through-hole included in the effective region AA1.

The through-hole included in a remaining ineffective region excluding the edge hole EH may have a shape corresponding to that of the through-hole included in the effective region.

In addition, the through-hole included in the ineffective region may have a different shape from that of the through-hole included in the effective region. The difference in a stress due to the position of the deposition mask may be adjusted through the same.

A through-hole edge portion is formed in the ineffective region UA, and a deposition defect may be removed at the edge portion of the effective region by the edge portion. That is, in the embodiment, since the edge hole EH of the deposition mask is formed in the non-effective region, the through-hole positioned at the edge portion of the effective region may be positioned at an inner side than the edge hole EH. Accordingly, one of the through-hole positioned at the edge portion of the effective region and the through-hole positioned inside the effective region may have the same deposition effect. Specifically, since the through-hole is included in the ineffective region UA, the uniformity of the through-hole positioned in the edge portion of the effective region and the through-hole positioned in the effective region may be improved.

The second effective region AA2 may be included in the second outer region OA2. The second effective region AA2 may include a plurality of through-holes for forming a deposition material. The second outer region OA2 surrounding the outer periphery of the second effective region AA2 may include a plurality of through-holes.

The second effective region AA2 may be in a shape corresponding to that of the first effective region AA1. The second outer region OA2 may be in a shape corresponding to that of the first outer region OA1.

The second outer region OA2 may further include two through-holes in the horizontal direction and the vertical direction, respectively, from the through-hole positioned at the outermost portion of the second effective region AA2. For example, in the second outer region OA2, two through-holes may be disposed in a row in the horizontal direction at an upper portion and a lower portion of the through-hole positioned at the outermost portion of the second effective region AA2, respectively. For example, in the second outer region OA2, two through-holes may be disposed in a row in the vertical direction at the left side and the right side of the through-hole positioned at the outermost portion of the second effective region AA2, respectively. The plurality of through-holes included in the second outer region OA2 is for reducing etching failure of the through-holes positioned at the outermost portion of the effective region. Accordingly, the deposition mask according to the embodiment may improve the uniformity of the plurality of through-holes positioned in the effective region, and may improve the quality of the deposition pattern produced through the same.

A through-hole set of the second outer region OA2 in which one through-hole positioned at an upper portion and a lower portion of the outermost portion of the second effective region AA2, respectively is disposed in a row in the horizontal direction, may be in a shape corresponding to that of the through-holes of the second effective region AA2. In addition, a through-hole set of the second outer region OA2 in which one through-hole positioned at the left side and the right side of the outermost portion of the second effective region AA2, respectively is disposed in a row in the vertical direction, may be in a shape corresponding to that of the through-holes of the second effective region AA2. Accordingly, the uniformity of the through-hole included in the second effective region AA2 may be improved.

Four through-holes positioned at an outermost corner of the second outer region OA2 may have a different shape from that of the through-hole included in the second effective region AA2.

For example, the four edge holes EH positioned at the outermost corner of the second outer region OA2 may have a circular shape. Here, the circular shape may mean a shape including a curved surface as a whole. The edge hole EH included in the second outer region OA2 may include a shape corresponding to that of the edge hole EH included in the first outer region OA1.

For example, the through-hole included in the first effective region AA1 may have a quadrilateral shape. The through-hole included in the second effective region AA2 may include a shape corresponding to that of the through-hole included in the first effective region AA1.

The third effective region AA3 may be included in the third outer region OA3. The third effective region AA3 may include a plurality of through-holes for forming a deposition material. The third outer region OA3 surrounding the outer periphery of the third effective region AA3 may include a plurality of through-holes.

The third effective region AA3 may be in a shape corresponding to that of the first effective region AA1. The third outer region OA3 may be in a shape corresponding to that of the first outer region OA1.

The third outer region OA3 may further include two through-holes in the horizontal direction and the vertical direction, respectively, from the through-hole positioned at the outermost portion of the third effective region AA3, respectively. For example, in the third outer region OA3, two through-holes may be disposed in a row in the horizontal direction at an upper portion and a lower portion of the through-hole positioned at the outermost portion of the third effective region AA3. For example, in the third outer region OA3, two through-holes may be disposed in a row in the vertical direction at the left side and the right side of the through-hole positioned at the outermost portion of the third effective region AA3, respectively. The plurality of through-holes included in the third outer region OA3 is for reducing etching failure of the through-holes positioned at the outermost portion of the effective region. Accordingly, the deposition mask according to the embodiment may improve the uniformity of the plurality of through-holes positioned in the effective region, and may improve the quality of the deposition pattern produced through the same.

A through-hole set of the third outer region OA3 in which one through-hole positioned at an upper portion and a lower portion of the outermost portion of the third effective region AA3, respectively is disposed in a row in the horizontal direction, may be in a shape corresponding to that of the through-holes of the third effective region AA3. In addition, a through-hole set of the third outer region OA3 in which one through-hole positioned at the left side and the right side of the outermost portion of the third effective region AA3, respectively is disposed in a row in the vertical direction, may be in a shape corresponding to that of the through-holes of the third effective region AA3. Accordingly, the uniformity of the through-hole included in the third effective region AA3 may be improved.

Four through-holes EH positioned at an outermost corner of the third outer region OA3 may have a different shape from that of the through-hole included in the third effective region AA3.

For example, the four edge holes EH positioned at the outermost corner of the third outer region OA3 may have a circular shape. Here, the circular shape may mean a shape including a curved surface as a whole. The edge hole EH included in the third outer region OA3 may include a shape corresponding that of to the edge hole EH included in the first outer region OA1.

For example, the through-hole included in the third effective region AA3 may have a quadrilateral shape. The through-hole included in the third effective region AA3 may include a shape corresponding to that of the through-hole included in the first effective region AA1.

Figure 8:
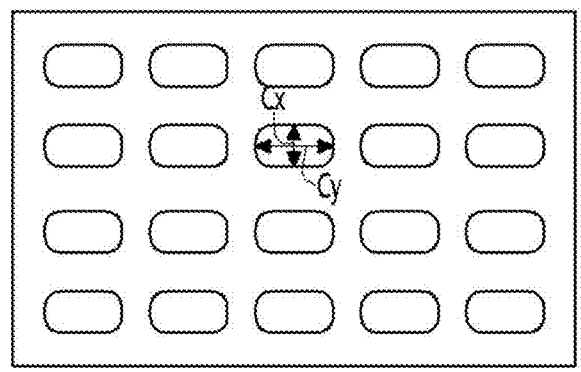
FIGS. 8 to 9 are views illustrating a plan view of an effective region of a deposition mask.
Figure 9:
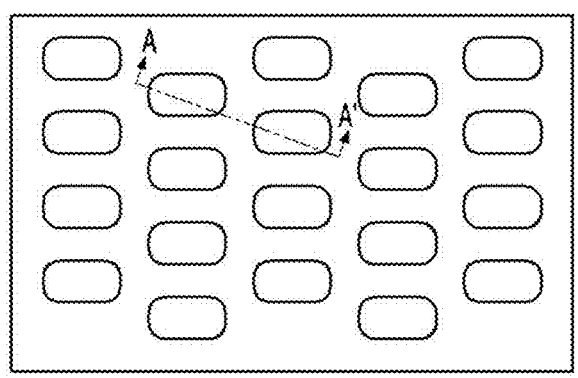

FIGS. 8 and 9 are views illustrating a plan view of an effective region of a deposition mask. FIGS. 8 and 9 are plan views of any one effective region of the first effective region AA1, the second effective region AA2, and the third effective region AA3. FIGS. 8 and 9 are views for illustrating arrangement of through-holes, and the deposition mask according to an embodiment is not limited to a number of through-holes in the drawings.

The deposition mask 100 may include a plurality of through-holes. The plurality of through-holes shown in FIGS. 8 and 9 may be the second surface hole V2. In the case of measuring a diameter Cx in the horizontal direction and a diameter Cy in the vertical direction of a reference hole which is any one of through-holes, a deviation between the diameters Cx in the horizontal direction and a deviation between the diameters Cy in the vertical direction of each of holes (six in total in the illustrated drawing) adjacent to the reference hole may be realized as 2% to 10%. That is, when a size deviation between the adjacent holes of one reference hole is realized as 2% to 10%, deposition uniformity may be secured.

For example, the size deviation between the reference hole and the adjacent holes may be 4% to 9%. For example, the size deviation between the reference hole and the adjacent holes may be 5% to 7%. For example, the size deviation between the reference hole and the adjacent holes may be 2% to 5%.

When the size deviation between the reference hole and the adjacent holes is less than 2%, an occurrence ratio of moire in an OLED panel after deposition may be increased. If the size deviation between the reference hole and the adjacent holes is more than 10%, an occurrence ratio of color unevenness in the OLED panel after deposition may be increased.

An average deviation of the diameters of the through-holes may be ±5 μm. For example, the average deviation of the diameters of the through-holes may be ±3 μm. In the embodiment, deposition efficiency may be improved by realizing the size deviation between the reference hole and the adjacent holes within ±3 μm.

The through-holes may be disposed in a row or may be disposed crossing each other according to a direction.

For example, referring to FIG. 8, the through-holes may be disposed in a row in a vertical axis, and may be disposed in a row in a horizontal axis.

For example, referring to FIG. 9, the through-holes may be disposed in a row in a vertical axis, and may be disposed crossing each other in a horizontal axis.

Alternatively, the through-holes may be disposed crossing each other in a vertical axis, and may be disposed in a row in a horizontal axis.

In the through-hole, a first diameter Cx measured in the horizontal direction and a second diameter Cy measured in the vertical direction may correspond to each other or may be different from each other. In the through-hole, a third diameter measured in a first diagonal direction corresponding to a sectional direction of A-A' and a fourth diameter measured in a second diagonal direction crossing the first diagonal direction may correspond to each other or be different from each other. The through-hole may be rounded.

Hereinafter, a deposition mask according to a first embodiment will be described in FIGS. 10 to 15.

Figure 10:
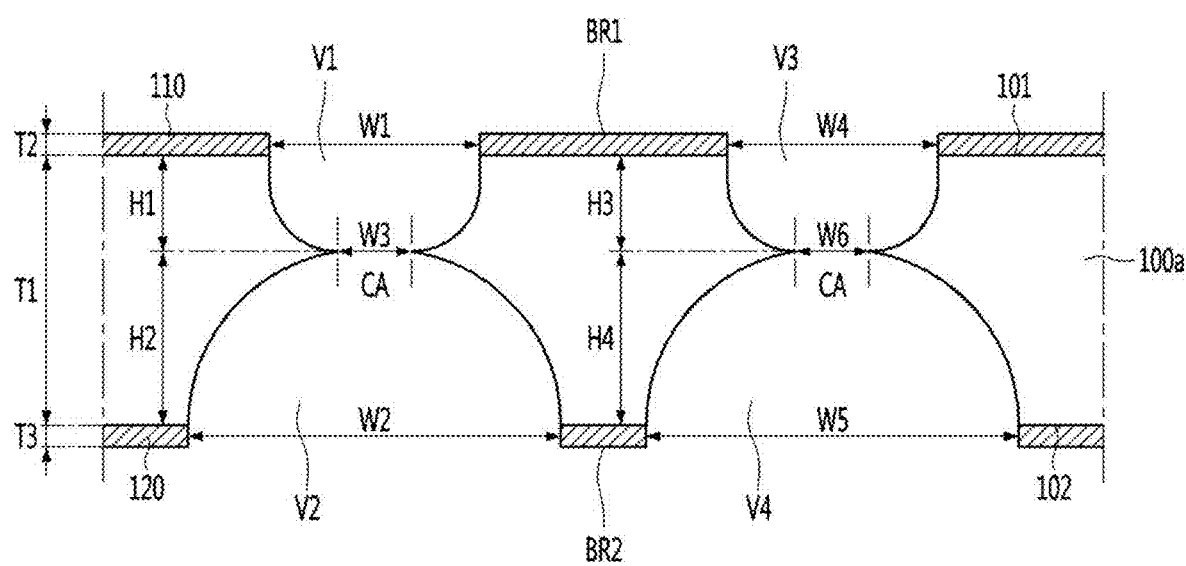
FIG. 10 is a view of a first embodiment illustrating a cross-sectional view taken along a line A-A' in FIG. 9.

FIG. 10 is an enlarged cross-sectional view of a plurality of through-holes of a deposition mask according to the first embodiment.

A metal plate included in a deposition mask according to an embodiment may include: a base metal plate including a first surface and a second surface facing each other; a first surface layer disposed on the first surface; and a second surface layer disposed on the second surface, wherein the first surface layer and the second surface layer may include an element different from that of the base metal plate, or an elemental content may be different. In this manner, an etch rate of the base metal plate may be different from those of the first surface layer and the second surface layer. The first surface layer and the second surface layer may be a metal surface layer, respectively.

A deposition mask according to an embodiment may include: a base metal plate; a first surface layer disposed on a first surface of the base metal plate; and a second surface layer disposed on a second surface opposite to the first surface of the metal layer, wherein the first surface layer and the second surface layer may include an element different from that of the base metal plate, or an elemental content may be different. In this manner, an etch rate of the base metal plate may be different from those of the first surface layer and the second surface layer. The deposition mask according to an embodiment may include a plurality of through-holes passing through which the base metal plate, the first surface layer, and the second surface layer, and including a first surface hole and a second surface hole communicating with each other. The deposition mask according to an embodiment may include a bridge region between each of the through-holes, and the first surface layer or the second surface layer may be disposed on the bridge region.

The metal plate may include a central region including a plurality of through-holes and an outer region positioned at an outer boundary of the central region. The central region may be a region that is involved in pattern formation, and the outer region may be a region, which is not involved in pattern formation. For example, the central region may be an effective region, and the outer region may be a region other than the effective region. A thickness of the first surface layer disposed at the central region may correspond to a thickness of the first surface layer disposed at the outer region, and a thickness of the second surface layer disposed at the central region may correspond to a thickness of the second surface layer disposed at the outer region.

Referring to FIG. 10, a deposition mask 100 may include a base metal plate 100a and a surface layer. For example, the deposition mask 100 may include the base metal plate 100a, a first surface layer 110 disposed on a first surface 101 of the base metal plate 100a, and a second surface layer 120 disposed on a second surface 102 opposite to the first surface 101.

The base metal plate 100a may include a metal material. The base metal plate 100a may include a nickel alloy. For example, the base metal plate 100a may be an alloy of nickel and iron. At this point, the nickel may be about 35 to 37 wt %, and the iron may be about 63 to 65 wt %. For example, the base metal plate 100a may include an invar including about 35 to 37 wt % of nickel, about 63 to 65 wt % of iron, and at least one of a trace amount of C, Si, S, P, Cr, Mo, Mn, Ti, Co, Cu, Fe, Ag, Nb, V, In, and Sb. Here, the small amount may mean not more than 1 w %. Specifically, here, the trace amount may refer to 0.5 wt % or less. However, the base metal plate 100a is not limited thereto, and may obviously include various metal materials.

Since the nickel alloy such as Invar has a small thermal expansion coefficient, it has advantage that a lifetime of the deposition mask may be increased. However, it has a problem that uniform etching for the nickel alloy such as the invar is difficult.

That is, in the nickel alloy such as the invar, the through-hole may be enlarged to a side surface as the etch rate increases in an initial stage of the etching, and thus de-filming of a photoresist layer may occur. In addition, when the invar is etched, it may be difficult to form a through-hole having a fine size as a size of the through-hole increases. Further, the through-hole is formed non-uniformly, so that a yield of the mask for deposition may be deteriorated.

Therefore, in an embodiment, a surface layer for surface modification may be disposed on a surface of the base metal plate with different composition, content, crystal structure and corrosion rate. Here, the surface modification may mean a layer made of various materials disposed on the surface to improve an etching factor.

The metal plate for the deposition mask of an embodiment may include a surface layer for preventing rapid etching on the surface of the base metal plate. The surface layer may be an etching barrier layer having a lower etch rate than that of the base metal plate. The surface layer may have a different crystal plane and crystal structure from those of the base metal plate. For example, as the surface layer includes a different element from that of the base metal plate, a crystal plane and a crystal structure may be different from each other.

In the same corrosion environment, the surface layer may have a different corrosion potential from that of the base metal plate. For example, when the same etchant is applied for the same time at the same temperature, the surface layer may have different corrosion currents or corrosion potentials from those of the base metal plate.

The base metal plate 100a may include an element different from that of the first surface layer 110. In addition, the base metal plate 100a may include an element different from that of the second surface layer 120. That is, the first surface layer 110 and the second surface layer 120 may include different elements not included in the base metal plate 100a.

For example, the first surface layer 110 and the second surface layer 120 may include chromium (Cr), and the base metal plate 100a may include an element other than Cr. As the first surface layer 110 and the second surface layer 120 include Cr, the corrosion rate at the surface of the metal plate may be lower than that of the surface of the base metal plate 100a.

Further, the content of Cr of the surface layer may be formed to be higher than that of the base metal plate, and the corrosion rate at the surface of the metal plate may be slower than that of the base metal plate 100a.

For example, when the base metal plate 100a is Invar including 36 wt % nickel and 64 wt % iron, the first surface layer 110 and the second surface layer 120 may each be an alloy layer including 0.01 to 24 wt % Cr. At this point, the first surface layer 110 and the second surface layer 120 may each include 1 to 24 wt % Cr, and 76 to 99 wt % nickel (Ni) or 76 to 99 wt % Ni and Fe.

For example, the first surface layer 110 and the second surface layer 120 may include titanium (Ti), and the base metal plate 100a may include an element other than titanium (Ti). As the first surface layer 110 and the second surface layer 120 include Ti, the corrosion rate at the surface of the metal plate may be slower than that of the surface of the base metal plate 100a.

In addition, the content of Ti of the surface layer may be formed to be higher than that of the base metal plate, and the corrosion rate at the surface of the metal plate may be slower than that of the base metal plate 100a.

For example, when the base metal plate 100a is Invar including 36 wt % nickel and 64 wt % iron, the first surface layer 110 and the second surface layer 120 may each be an alloy layer including 0.5 to 10 wt % Ti. At this point, the first surface layer 110 and the second surface layer 120 may each include 0.5 to 10 wt % Ti, and 90 to 99.5 wt % Ni, or 90 to 99.5 wt % Ni and Fe.

For example, the first surface layer 110 and the second surface layer 120 may include manganese (Mn), and the base metal plate 100a may include an element other than Mn. As the first surface layer 110 and the second surface layer 120 include a Mn-based alloy, the corrosion rate at the surface of the metal plate may be slower than that of the surface of the base metal plate 100a.

In addition, the content of Mn of the surface layer may be formed to be higher than that of the base metal plate, and the corrosion rate at the surface of the metal plate may be slower than that of the base metal plate 100a.

For example, the first surface layer 110 and the second surface layer 120 may include molybdenum (Mo), and the base metal plate 100a may include an element other than Mo. As the first surface layer 110 and the second surface layer 120 include a Mo-based alloy, the corrosion rate at the surface of the metal plate may be slower than that of the surface of the base metal plate 100a.

In addition, the content of Mo of the surface layer may be formed to be higher than that of the base metal plate, and the corrosion rate at the surface of the metal plate may be slower than that of the surface of the base metal plate 100a.

For example, the first surface layer 110 and the second surface layer 120 may include silver (Ag), and the base metal plate 100a may include an element other than Ag. As the first surface layer 110 and the second surface layer 120 include a Ag-based alloy, the corrosion rate at the surface of the metal plate may be lower than that of the surface of the base metal plate 100a.

In addition, the content of Ag of the surface layer may be formed to be higher than that of the base metal plate, and the corrosion rate at the surface of the metal plate may be slower than that of the base metal plate 100a.

For example, the first surface layer 110 and the second surface layer 120 may include zinc (Zn), and the base metal plate 100a may include an element other than Zn. As the first surface layer 110 and the second surface layer 120 include a Zn-based alloy, the corrosion rate at the surface of the metal plate may be slower than that of the surface of the base metal plate 100a.

In addition, the content of Zn of the surface layer may be formed to be higher than that of the base metal plate, and the corrosion rate at the surface of the metal plate may be slower than that of the surface of the base metal plate 100a.

For example, the first surface layer 110 and the second surface layer 120 may include nitrogen (N), and the base metal plate 100a may include an element other than N. As the first surface layer 110 and the second surface layer 120 include a N-based alloy, the corrosion rate at the surface of the metal plate may be slower than that of the surface of the base metal plate 100a.

In addition, the content of N of the surface layer may be formed to be higher than that of the base metal plate, and the corrosion rate at the surface of the metal plate may be slower than that of the surface of the base metal plate 100a.

For example, the first surface layer 110 and the second surface layer 120 may include aluminum (Al), and the base metal plate 100a may include an element other than Al. As the first surface layer 110 and the second surface layer 120 include an Al-based alloy, the corrosion rate at the surface of the metal plate may be slower than that of the surface of the base metal plate 100a.

In addition, the content of Al of the surface layer may be formed to be higher than that of the base metal plate, and the corrosion rate at the surface of the metal plate may be slower than that of the surface of the base metal plate 100a.

For example, the first surface layer 110 and the second surface layer 120 may include an oxygen element. That is, the first surface layer 110 and the second surface layer 120 may be a metal oxide layer. Specifically, the first surface layer 110 and the second surface layer 120 may include at least one of iron oxide and nickel oxide as metal oxides. The content of oxygen in the first surface layer 110 may be higher than that of oxygen in the base metal plate 100a. The content of oxygen in the second surface layer 120 may be higher than that of oxygen in the base metal plate 100a. As the first surface layer 110 and the second surface layer 120 include the metal oxides, the corrosion rate at the surface of the metal plate may be slower than that of the surface of the base metal plate 100a.

In addition, the content of O of the surface layer may be formed to be higher than that of the base metal plate, and the corrosion rate at the surface of the metal plate may be slower than that of the surface of the base metal plate 100a.

In an embodiment, the first surface layer 110 and the second surface layer 120 include a different element from that of the base metal plate 100a, so that the corrosion rate of the first and second surface layers may be slower than that of the base metal plate. Accordingly, the etching factor of the deposition mask according to the embodiment may be increased. In addition, since the deposition mask according to the embodiment may uniformly form a plurality of through-holes, the deposition efficiency of R, G, and B patterns may be improved. Here, including different elements may mean that the base metal plate 100a and the surface layer include at least one different element, or even though all the elements are the same, alloys having different contents are included.

The base metal plate 100a may have a different composition of included elements from that of the first surface layer 110. In addition, the base metal plate 100a may have a different composition of included elements from that of the second surface layer 120. That is, even though the first surface layer 110 and the second surface layer 120 include the same element as the element constituting the base metal plate 100a, the same element may have different contents.

For example, when the base metal plate 100a is Invar including 36 wt % nickel and 64 wt % iron, even though the first surface layer 110 and the second surface layer 120 include at least one of nickel and iron, the first surface layer 110 and the second surface layer 120 may have different contents of nickel or iron from that of the base metal plate 100a.

The content of nitrogen in the first surface layer 110 may be larger or smaller than that of the base metal plate 100a. In addition, the content of nitrogen in the second surface layer 120 may be larger or smaller than that of nitrogen in the base metal plate 100a. For example, the first surface layer 110 and the second surface layer 120 may include a nitrogen (N) element. Specifically, each layer of the first surface layer 110 and the second surface layer 120 may be a nitrogen-based alloy including 20 to 70 wt % N element.

The content of iron in the first surface layer 110 may be larger or smaller than that of the base metal plate 100a. In addition, the content of iron in the second surface layer 120 may be larger or smaller than that of iron in the base metal plate 100a. For example, the first surface layer 110 and the second surface layer 120 may include an iron (Fe) element. Specifically, each layer of the first surface layer 110 and the second surface layer 120 may be an iron-based alloy including 20 to 70 wt % Fe element.

The first surface layer 110 and the second surface layer 120 may include an element corresponding to each other. Here, the "corresponding with each other" may mean that a content percentage of an element is the same, and may include an error range due to tolerance.

The first surface layer 110 and the second surface layer 120 may include at least one metal of Ni, Cr, Fe, Ti, Mn, O, Mo, Ag, Zn, N, Al, and alloys thereof.

For example, the first surface layer 110 and the second surface layer 120 may include any one single element of Ni, Cr, Fe, Ti, Mn, O, Mo, Ag, Zn, N, and Al.

For example, the first surface layer 110 and the second surface layer 120 may be a binary alloy including two elements of Ni, Cr, Fe, Ti, Mn, O, Mo, Ag, Zn, N, and Al.

For example, the first surface layer 110 and the second surface layer 120 may be a ternary alloy including three elements of Ni, Cr, Fe, Ti, Mn, O, Mo, Ag, Zn, N, and Al.

A thickness of the base metal plate 100a may be greater than that of the surface layer. For example, a thickness T1 of the base metal plate 100a may be greater than a thickness T2 of the first surface layer 110 and a thickness T3 of the second surface layer 120.

A thickness of the metal plate 100 may be 5 to 50 μm. For example, the thickness of the metal plate 100 may be 5 to 30 μm, or may be 10 to 25 μm. When the thickness of the metal plate 100 is less than 5 μm, manufacturing efficiency may be low.

When the thickness of the metal plate 100 is more than 50 μm, process efficiency for forming a through-hole may be deteriorated.

The thickness T1 of the base metal plate 100a may be 50 μm or less. For example, the thickness T1 of the base metal plate 100a may be 30 μm or less. In addition, the thickness T1 of the base metal plate 100a may be 25 μm or less. Further, the thickness T1 of the base metal plate 100a may be 20 μm or less.

The first surface layer 110 and the second surface layer 120 may have a thickness corresponding to each other. Here, the "corresponding" may include an error due to tolerance. The thickness T2 of the first surface layer 110 may be 0.5 to 1000 nm. For example, the thickness T2 of the first surface layer 110 may be 5 to 850 nm When the thickness T2 of the first surface layer 110 is less than 0.5 nm, the effect of lowering the etch rate on the first surface 101 may be reduced, and thus uniformity of the through-hole may be deteriorated. In addition, a natural oxide film of 5 nm or less may be generated.

For example, when the thickness T2 of the first surface layer 110 is less than 0.5 nm a through-hole having a large variation in thickness and/or width is formed, so that the pattern formed by the metal plate having the through-hole may not be uniform, and thus manufacturing efficiency of the display device may be deteriorated.

In addition, when the thickness T2 of the first surface layer 110 is less than 0.5 nm, the effect of lowering the etch rate on the first surface 101 may be reduced, and thus it is difficult to form a through-hole having a fine size.

In addition, when the thickness T2 of the first surface layer 110 is less than 0.5 nm, the surface roughness of an inner circumferential surface of the first surface hole V1 increases, so that quality of the deposition pattern formed through the first surface hole V1 may be degraded, and thus process efficiency may be deteriorated.

Meanwhile, when the thickness T2 of the first surface layer 110 is more than 1000 nm, manufacturing efficiency may be deteriorated.

The thickness T3 of the second surface layer 120 may be 0.5 to 1000 nm. For example, the thickness T3 of the second surface layer 120 may be 30 to 500 nm.

When the thickness T3 of the second surface layer 120 is less than 0.5 nm, the effect of lowering the etch rate on the second surface 102 may be reduced, and thus uniformity of the through-hole may be deteriorated. For example, when the thickness T3 of the second surface layer 120 is less than 0.5 nm, a through-hole having a large variation in thickness and/or width is formed, so that the pattern formed by the metal plate having the through-hole may not be uniform, and thus manufacturing efficiency of the display device may be deteriorated.

In addition, when the thickness T3 of the second surface layer 120 is less than 0.5 nm, the effect of lowering the etch rate on the second surface 102 may be reduced, and thus it is difficult to form a through-hole having a fine size.

In addition, when the thickness T3 of the second surface layer 120 is less than 0.5 nm, the surface roughness of an inner circumferential surface of the second surface hole V2 may be increased.

Meanwhile, when the thickness T3 of the second surface layer 120 is more than 1000 nm, manufacturing efficiency may be deteriorated.

The metal plate 100 may have different widths of through-holes along the thickness direction of the through-holes. For example, a width W1 of the first surface hole V1 may be greater than a width W3 of the connecting part CA. Specifically, the width of the through-hole may be reduced as the first surface hole V1 goes from the first surface 101 toward the connecting part CA. More specifically, the width of the through-hole may be gradually reduced as the first surface hole V1 goes from the first surface 101 toward the connecting part CA.

For example, a width W2 of the second surface hole V2 may be greater than the width W3 of the connecting part CA. Specifically, the width of the through-hole may be reduced as the second surface hole V2 goes from the second surface 102 toward the connecting part CA. More specifically, the width of the through-hole may be gradually reduced as the second surface hole V2 goes from the second surface 102 toward the connecting part CA.

The deposition mask according to an embodiment may include a plurality of through-holes. Specifically, the metal plate may include a central region including the plurality of through-holes and an outer region positioned at the central region. At this time, a width of one through-hole may be 20 μm or more. For example, the width of the through-hole may be 20 to 40 μm. For example, at least one of the width W1 of the first surface hole and the width W2 of the second surface hole may have a width of 20 μm or more. For example, at least one of the width W1 of the first surface hole and the width W2 of the second surface hole may have a width of 20 to 40 μm.

When the width of the through-hole is more than 40 μm, it may be difficult to form a fine deposition pattern.

The plurality of through-holes may include a first through-hole and a second through-hole adjacent to the first through-hole. The metal plate positioned between the first through-hole and the second through-hole may be defined as a bridge region (BR). The BR may be disposed at the central region.

A thickness of the first surface layer disposed at the central region may correspond to a thickness of the first surface layer disposed at the outer region.

A thickness of the second surface layer disposed at the central region may correspond to a thickness of the second surface layer disposed at the outer region.

A first surface of the metal plate may include a first bridge region BR1 and a second surface opposite to the first surface may include a second bridge region BR2.

A metal plate, a first surface layer disposed on the first surface of the metal plate, and a second surface layer disposed on the second surface of the metal plate may be disposed at the bridge region.

A metal plate, a first surface layer disposed on the first surface of the metal plate, and a second surface layer disposed on the second surface of the metal plate may be disposed in the outer region of the metal plate.

The through-hole may be formed passing through the base metal plate, the first surface layer, and the second surface layer. Accordingly, the base metal plate, the first surface layer, and the second surface layer may be exposed at an inner side surface of the through-hole.

The inner side surface of the through-hole may include a curved surface. The inner side surface of the through-hole may include a curved surface in whole or in part. The inner side surface of the through-hole may include a curved surface of which a curvature changes. A curvature of each of the base metal plate, the first surface layer, and the second surface layer may be different from each other at the inner side surface of the through-hole. At this time, the curvature of each of the base metal plate, the first surface layer and the second surface layer may mean that it is measured at ½ point of the thickness of the base metal plate, ½ point of the thickness of the first surface layer and ½ point of the thickness of the second surface layer.

A height H2 of the second surface hole V2 may be greater than a height H1 of the first surface hole V1.

Meanwhile, since a third surface hole V3 adjacent to the first surface hole V1 and formed on the first surface 101 communicates with a fourth surface hole V4 adjacent to the second surface hole V2 and formed on the second surface 102, through the connecting part CA, a through-hole may be formed.

A width W5 of the fourth through-hole V4 may be greater than a width W4 of the third through-hole V3. For example, the width W4 of the third through-hole V3 may be greater than a width W6 of the connecting part CA. Specifically, the width of the through-hole may be reduced as the third surface hole V3 goes from the first surface 101 toward the connecting part CA. Specifically, the width of the through-hole may be gradually reduced as the third surface hole V3 goes from the first surface 101 toward the connecting part CA.

For example, the width W5 of the fourth surface hole V4 may be greater than the width W6 of the connecting part CA. Specifically, the width of the through-hole may be reduced as the fourth surface hole V4 goes from the second surface 102 toward the connecting part CA. More specifically, the width of the through-hole may be gradually reduced as the fourth surface hole V4 goes from the second surface 102 toward the connecting part CA.

A height H4 of the fourth surface hole V4 may be greater than a height H3 of the third surface hole V3.

The etch rate of the base metal plate 100a may be different from the etch rate of the first surface layer 110 and the second surface layer 120. For example, the etch rate of the base metal plate 100a positioned inside in the thickness direction of the metal plate may be faster than that of the first and second surface layers 110 and 120 positioned outside in the thickness direction of the metal plate. In other words, the etch rate of the first surface layer 110 may be slower than that of the base metal plate 100a. The etch rate of the second surface layer 120 may be slower than that of the base metal plate 100a. Specifically, the first surface layer 110 and the second surface layer 120 may include an element having higher corrosion resistance than an element constituting the base metal plate 100a, so that the etch rate at the surface layer may be slower than that of the base metal plate. That is, the surface layer may be a metal surface layer including a metal element having higher corrosion resistance than the element constituting the base metal plate.

A conventional metal plate has a problem that adjacent through-holes may be overlapped with each other as an etch rate of an outside of the metal plate having a large contact area of an etchant is faster than that of an inside of the metal plate. That is, in the deposition mask manufactured using only the base metal plate 100a, as the etch rate of the first surface 101 and the second surface 102 of the base metal plate 100a in contact with an etchant increases, the width of the through-hole formed on the first surface 101 and the second surface 102 may be increased. Accordingly, it is difficult to form a through-hole having a fine pattern, and a manufacturing yield may be lowered. In addition, uniformity of a plurality of through-holes may be lowered. Therefore, the OLED panel manufactured through the same may have low deposition efficiency of a pattern, and deposition uniformity of the pattern may be deteriorated.

Meanwhile, an embodiment may include the first surface layer 110 and the second surface layer 120 on both surfaces of the base metal plate 100a, and the first surface layer 110 and the second surface layer 120 may include an element different from that of the base metal plate 100a. Accordingly, the etch rate of the first surface layer 110 and the second surface layer 120 may be slower than that of the base metal plate 100a.

That is, the first surface layer 110 and the second surface layer 120 may include a metal element or a metal oxide having a higher corrosion resistance than that of the base metal plate 100a, and the first surface layer 110 and the second surface layer 120 are disposed at a thickness of 0.5 to 1000 nm respectively, so that a fine through-hole may be formed.

For example, in the metal plate according to an embodiment, when the first surface layer 110 and the second surface layer 120 are disposed at a thickness of more than 5 nm and 800 nm or less, 10 nm to 600 nm, and 30 nm to 500 nm, respectively, the width W1 of the first surface hole V1 may correspond to the width W4 of the third through-hole V3, and the width W2 of the second surface hole V2 may correspond to the width W5 of the fourth through-hole V4. For example, in the metal plate according to the embodiment, when the first surface layer 110 and the second surface layer 120 are disposed at a thickness of more than 5 nm and 800 nm or less, 10 nm to 600 nm, and 30 nm to 500 nm, respectively, the height H1 of the first surface hole V1 may correspond to the height H3 of the third surface hole V3, and the height H2 of the second surface hole V2 may correspond to the height H4 of the fourth surface hole V4. That is, uniformity of the width and height of the plurality of through-holes may be improved.

That is, the metal plate according to the embodiment may be formed such that the through-hole may have a small width and a deep thickness since the etch rate at a region in which the first surface layer 110 and the second surface layer 120 are disposed may be slow. Accordingly, it is possible to prevent a de-filming phenomenon of a photoresist layer from being caused by a rapid etching at a metal surface.

In addition, the metal plate used for manufacturing the deposition mask according to an embodiment may control the etch rate at the surface, and thus a manufacturing yield of the through-hole having a fine pattern may be improved and uniformity of the plurality of through-holes may be improved. Accordingly, the OLED panel manufactured by using such a deposition mask has excellent deposition efficiency of the pattern and may improve deposition uniformity. In addition, the surface layer according to an embodiment includes at least one of a metal or a metal oxide having high corrosion resistance, so that an adhesion force of the photoresist layer may be improved, and thus the photoresist layer may be prevented from being de-filmed or separated in the etching process. Accordingly, the metal plate according to an embodiment may improve a manufacturing yield and process efficiency of the plurality of through-holes.

Referring to FIGS. 11 to 15, the manufacturing process of a deposition mask according to a first embodiment will be described.

A deposition mask according to an embodiment may include: preparing a base metal plate; disposing a first surface layer on a first surface of the base metal plate; disposing a second surface layer on a second surface of the base metal plate; forming a photoresist layer to dispose a first photoresist layer on the first surface layer and a second photoresist layer on the second surface layer; and an etching to form a through-hole in which a first surface hole of the first surface and a second surface hole of the second surface communicate with each other. In addition, the metal plate used in the deposition mask according to an embodiment may further include removing the first photoresist layer and the second photoresist layer after the etching.

Further, the first surface layer and the second surface layer may be formed simultaneously. Accordingly, process efficiency may be improved. Furthermore, of course, the first photoresist layer and the second photoresist layer may be formed step by step.

In addition, the through-hole may be formed by forming the first surface hole and the second surface hole step by step.

Further, a first photoresist for forming the first surface hole may be formed, an anti-etching protective layer may be formed at the second surface, and then the first surface hole may be formed, and a photoresist for forming the second surface hole may be formed, an anti-etching protective layer may be formed at the first surface, and then the second surface hole may be formed.

Furthermore, an embodiment may further include removing the first and second surface layers after the removing of the photoresist layer. In this manner, foreign matters generated due to the surface layer may be prevented during deposition of an OLED. In this case, the content of Ni of the first surface from which the surface layer has been removed may be different from the content of Ni of a center, which is one half of a thickness of the base metal plate. Preferably, the content of Ni of the first surface may be greater than that of the center, which is one-half of the thickness of the base metal plate.

First, a first step is a preparing step of a base metal plate 100a. A nickel alloy may be prepared for the base metal plate 100a. For example, the base metal plate 100a may be an alloy of nickel and iron.

In addition, impurities may be contained for improving a strength. The impurities may include at least one of C, Si, Mn, P, S, Al and Cr, and may be 2 w % or less, 1.7 W % or less, or 1.5 w % or less of the entire base metal plate. When exceeding 2 w %, the thermal expansion characteristic which is a basic characteristic of Invar may be deteriorated.

The preparing step of the base metal plate may include various thickness reduction steps. For example, the base metal plate may further include a thickness reduction step by a rolling step.

Figure 11:
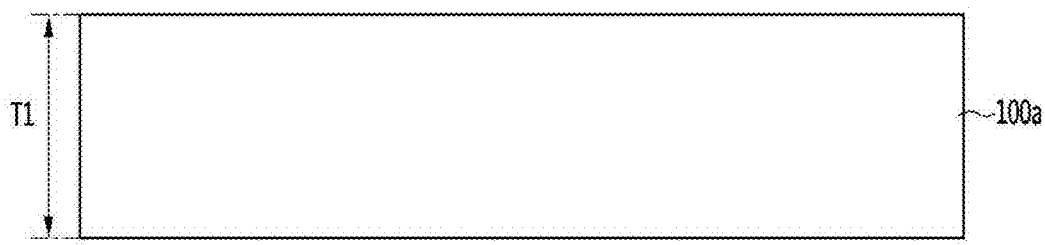
FIGS. 11 to 15 are views illustrating a manufacturing process of a deposition mask according to the first embodiment.

That is, a second step may be a rolling step of the base metal plate 100a. Referring to FIG. 11, the base metal plate 100a may have a thickness T1 of 5 μm to 50 μm. For example, the base metal plate 100a may have a thickness T1 of 30 μm or less. Here, the thickness of the base metal plate 100a may be a thickness measured after a rolling process. At this time, the rolling step may be a cold rolling step. That is, an initial metal substrate has a thickness of more than 30 μm, the base metal plate processed by the thickness reduction step by the rolling step may have a thickness of 30 μm or less (e.g. 25 μm, 20 μm).

A third step is a disposing step of the first surface layer on the first surface of the base metal plate.

A fourth step is a disposing step of the second surface layer on the second surface of the base metal plate.

Figure 12:
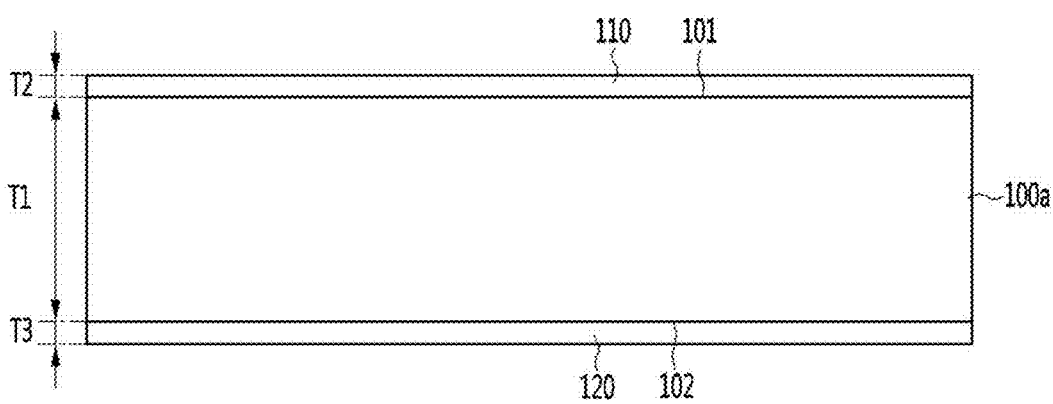

Referring to FIG. 12, first and second surface layers 110 and 120 may be formed on the base metal plate 100a. For example, the base metal plate 100a may form the first surface layer 110 on one surface of the base metal plate 100a by a deposition process. Next, the second surface layer 120 may be formed on the other surface of the base metal plate 100a opposite to the one surface by the deposition process.

In addition, the first surface layer and the second surface layer may be deposited together.

In addition, since the first surface layer 110 and the second surface layer 120 may be disposed on the base metal plate 100a with a thickness corresponding to each other, an etch rate of a first surface 101 and a second surface 102 of the base metal plate 100a may be lowered.

Figure 13:
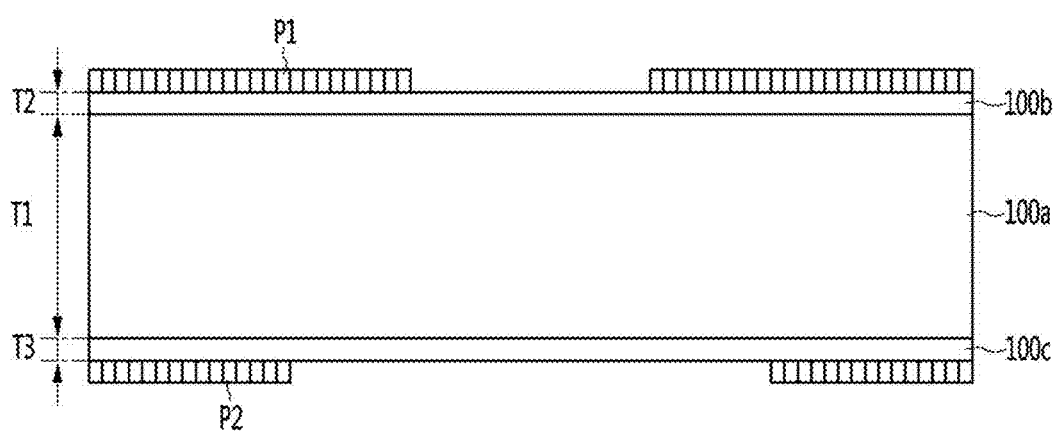

A fifth step is a photoresist layer forming step in which a first photoresist layer P1 is disposed on the first surface layer 110 and a second photoresist layer P2 is disposed on the second surface layer 120. Referring to FIG. 13, a first photoresist layer P1 having an open region may be disposed on the first surface layer 110, and a second photoresist layer P2 having an open region may be disposed on the second surface layer 120. Specifically, a photoresist material is coated on each of the first surface layer 110 and the second surface layer 120, and the first photoresist layer P1 and the second photoresist layer P2 may be disposed by exposure and developing processes, respectively.

The first photoresist layer P1 and the second photoresist layer P2 are disposed such that the widths of the open regions of the first photoresist layer P1 and the second photoresist layer P2 are different from each other, so that the width of the first surface hole V1 formed on the first surface 101 and the second surface hole V2 formed on the second surface 102 may be different.

The first photoresist layer P1 and the second photoresist layer P2 may include a plurality of open regions for forming through-holes in the metal plate.

A sixth step is a forming step of a through-hole in the metal plate.

The first photoresist layer P1 may be partially disposed on the first surface layer 110. Through-holes may not be formed in a region in which the first photoresist layer P1 is disposed on the first surface layer 110. That is, the first photoresist layer P1 may include a substance capable of maintaining physical/chemical stability in the etching process. Accordingly, the first photoresist layer P1 may inhibit etching of the first surface layer 110 and the base metal plate 100a disposed under the first photoresist layer P1.

The second photoresist layer P2 may be partially disposed on the second surface layer 120. Through-holes may not be formed in a region in which the second photoresist layer P2 is disposed on the second surface layer 120. That is, the second photoresist layer P2 may include a substance capable of maintaining physical/chemical stability in the etching process. Accordingly, the second photoresist layer P2 may inhibit etching of the second surface layer 120 and the base metal plate 100a disposed under the second photoresist layer P2.

Meanwhile, the open regions of the first photoresist layer P1 and the second photoresist layer P2 may be etched in the etching process. Accordingly, a through-hole of a metal plate may be formed in the open regions of the first photoresist layer P1 and the second photoresist layer P2.

In addition, after a first photoresist for forming a first surface hole is formed and an etching preventive protection layer is formed on a second surface, the first surface hole may be formed, and after a photoresist for forming a second surface hole is formed and an etching preventive protection layer is formed on a first surface, the second surface hole may be formed.

Figure 14:
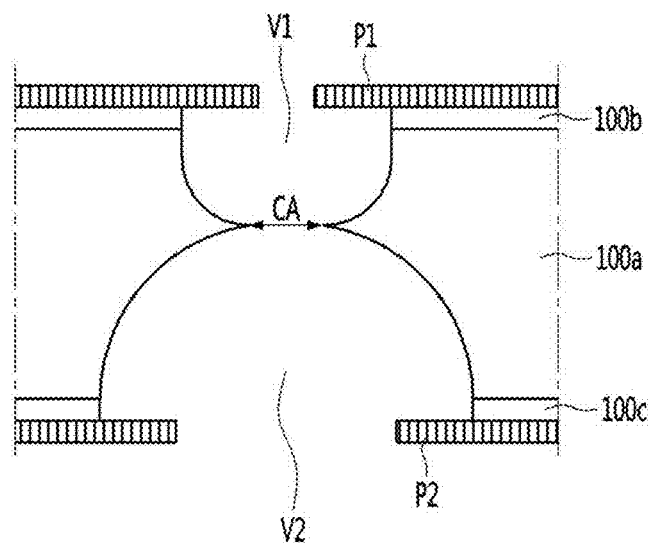

Referring to FIG. 14, the first surface hole V1 is formed on a first surface of a metal plate by an etching process, the second surface hole V2 is formed on a second surface opposite to the first surface, and a through-hole may be formed by the first surface hole V1 and the second surface hole V2 being communicated with each other by the connecting part CA.

For example, the etching process may be performed by a wet etching process. Accordingly, since the first surface 101 and the second surface 102 may be simultaneously etched, process efficiency may be improved. As an example, the wet etching process may be performed at about 45° C. by using an etchant containing iron chloride. At this time, the etchant may contain 35 to 45 wt % of FeCl3. Specifically, the etchant may contain 36 wt % of FeCl3. For example, a specific gravity of the etchant containing 43 wt % of FeCl3 may be 1.47 at 20° C. A specific gravity of the etchant containing 41 wt % of FeCl3 may be 1.44 at 20° C. A specific gravity of the etchant containing 38 wt % of FeCl3 may be 1.39 at 20° C. However, an embodiment is not limited thereto, and various etchants within a range in which an etch rate of a metal surface layer may be slower than that of a base metal plate may be used.

Figure 15:
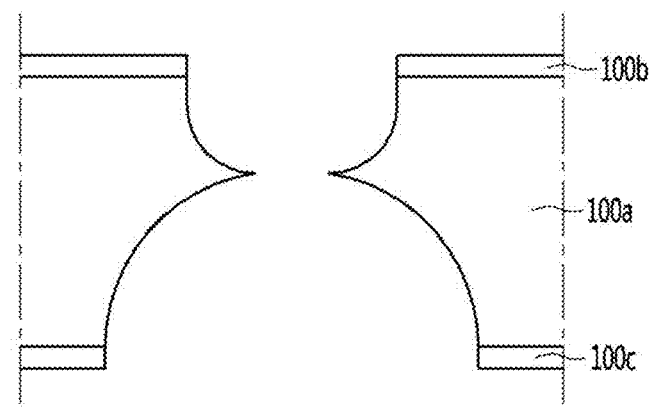

A seventh step is a removing step of the first photoresist layer and the second photoresist layer. Referring to FIG. 15, the first surface layer 110 and the second surface layer 120 are disposed on the base metal plate 100a by removing the first photoresist layer P1 and the second photoresist layer P2, and a metal plate having a plurality of through-holes may be formed.

An etching factor of at least one surface hole of the first surface hole and the second surface hole calculated by the following Equation 1 in the above process may be 2.5 or more. Accordingly, a through-hole of an embodiment may have excellent etching characteristics, and it is possible to prevent a decrease in production yield due to lifting or separation of a photoresist layer.

$$\text{Etching Factor} = B/A \qquad \text{Equation 1}$$

In the equation, the B is a depth of one surface hole of the first surface hole and the second surface hole etched, and the A refers to a width of the photoresist layer extending from a bridge region on the one surface hole and protruding toward a center of the one surface hole. Specifically, the A refers to an average value of a width of one side of the photoresist layer protruding on the one surface hole and a width of the other side opposite to the one side.

Figure 18:
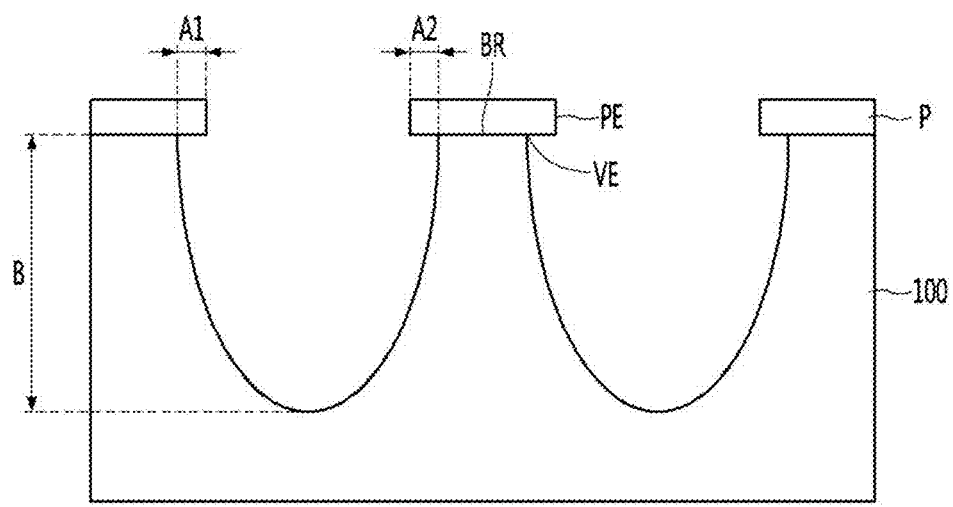
FIG. 18 is view illustrating a cross-sectional view in an etching process of an embodiment.

Referring to FIG. 18, an etching step of forming one surface hole of the first surface hole and the second surface hole will be described.

In the above etching step, one surface hole of the first surface hole and the second surface hole may be formed in a region in which the photoresist layer P is opened. At this time, since an etchant may contact a lower portion of a side surface of a photoresist layer positioned in the open region, undercutting may occur. Accordingly, a protrusion portion of the photoresist layer may be positioned on the one surface hole.

The protruding portion may be disposed on the surface hole while being spaced apart from the surface hole. The protruding portion may surround an end VE of the surface hole. The protruding portion may partially cover the surface hole. The end PE of the protruding portion may be spaced apart from the end VE of the surface hole at a predetermined distance. The end PE of the protruding portion may be disposed on the surface hole. The protruding portion may not be in contact with the surface hole. The protruding portion may be disposed on the surface hole by extending a photoresist layer in contact with the bridge region or the outer region.

A shape of one of the first surface hole and the second surface hole may correspond to a shape of the open region of the photoresist layer. For example, when one of the first surface hole and the second surface hole has a circular shape, the open region of the photoresist layer may also have a circular shape.

An average diameter of one surface hole of the first surface hole and the second surface hole may be larger than an average diameter of the open region of the photoresist layer on the one surface hole. For example, the average diameter of the one surface hole of the first surface hole and the second surface hole may be 25 μm to 35 μm. For example, the average diameter of the open region of the photoresist layer on the one surface hole may be 20 μm to 30 μm.

That is, a width of the open region of the photoresist layer and that of the through-hole may be different from each other. Specifically, a width of one surface hole of the first surface hole and the second surface hole formed under the open region of the photoresist layer may be larger than that of the open region of the photoresist layer. Here, the width of the one surface hole may refer to a maximum diameter measured on one surface of the metal plate. Further, the width of the one surface hole compared with the width of the open region of the photoresist layer may refer to a width disposed at a position corresponding to "on" or "under".

As a difference between the width of the open region of the photoresist layer and the width of the one surface hole of the first surface hole and the second surface hole is smaller, etching characteristics may be better. Specifically, as the difference in width between the width of the open region of the photoresist layer and the width of the one surface hole of the first surface hole and the second surface hole is smaller, a region in which undercutting occurs may be decreased. Accordingly, the convenience of designing through-holes may be improved, and fine through-holes may be formed efficiently in a process.

A ratio of the average diameter of the open region of the photoresist layer and the average diameter of the surface hole may have a value of 1:1.5 or less. For example, the ratio of the average diameter of the open region of the photoresist layer and the average diameter of the surface hole may have a value of 1:1.1 to 1:1.4. For example, the ratio of the average diameter of the open region of the photoresist layer and the average diameter of the surface hole may have a value of 1:1.3 to 1:1.4. When the ratio of the average diameter of the open region of the photoresist layer and the average diameter of the surface hole exceeds 1:1.5, etching characteristics may be deteriorated.

The value A of the Equation 1 may be expressed as Equation 2 below.

$$A = (A1 + A2)/2 \qquad \text{Equation 2}$$

Referring to FIG. 18, the A1 in the Equation 2 may refer to a width of one side of a protruding portion of a photoresist layer on the one surface hole, A2 in the Equation 2 may refer to a width of the other side opposite to the one side of the protruding portion of the photoresist layer on the one surface hole.

That is, an etching factor of one of the first surface hole and the second surface hole may be redefined by Equation 3 below.

$$\text{Etching Factor} = \frac{B}{\left\{\frac{(A1+A2)}{2}\right\}} \qquad \text{Equation 3}$$

A deposition mask according to an embodiment may be measured to have an etching factor of 2.5 or more in an etching step of forming a through-hole. It may mean that as the etching factor is larger, the etching property is more excellent in a thickness direction of a metal plate, that is, in a depth direction of the through-hole.

It may mean that as the etching factor is smaller, a width of the through-hole becomes larger. That is, as the etching factor is smaller, the width of the through-hole becomes larger, so that a phenomenon of which the photoresist layer is lifted or separated may occur.

At least one surface of the metal plate includes a surface hole, and the value A of the Equation 1 may be 8 or less. For example, the value A of the Equation 1 may be 5 or less. For example, the value A of the Equation 1 may be 4 to 5.

When the value A of the Equation 1 exceeds 8, the etching factor may be decreased. When the value A of the Equation 1 is more than 8, a difference between the average diameter of the open region of the photoresist layer and the average diameter of the one through-hole is large, so that it is difficult to design fine through-holes.

Hereinafter, the present invention will be described in more detail with reference to exemplary embodiments and comparative examples. Such an embodiment is merely an example in order to explain the present invention in more detail. Therefore, the present invention is not limited to such an embodiment.

Experimental Example 1: Size evaluation of average diameter of open region of photoresist layer and average diameter of surface hole formed under open region.

Exemplary Embodiment 1

A first surface layer and a second surface layer of a Ni—Cr alloy material were formed by deposition on a cold-rolled Invar base metal plate.

At this time, the Ni—Cr alloy was an alloy of 76 to 99 wt % of nickel and 1 to 24 wt % of chromium.

Thereafter, a photoresist layer including a plurality of open regions was formed on one of the first surface layer and the second surface layer. Thereafter, an etching process was performed only on a surface in which the photoresist layer including a plurality of open regions was formed.

In this manner, one surface hole of a first surface hole and a second surface hole was formed under the open region of the photoresist layer.

Exemplary Embodiment 2

A first surface layer and a second surface layer of a Ni—Cr—Fe alloy material were formed by deposition on a cold-rolled Invar base metal plate.

At this time, the Ni—Cr—Fe alloy was an alloy of 76 to 99 wt % of nickel and iron, and 1 to 24 wt % of chromium.

Thereafter, a photoresist layer including a plurality of open regions was formed on one of the first surface layer and the second surface layer. Thereafter, an etching process was performed only on a surface in which the photoresist layer including a plurality of open regions was formed.

In this manner, one surface hole of a first surface hole and a second surface hole was formed under the open region of the photoresist layer. In Exemplary Embodiment 2, thicknesses of respective layers and conditions of an etching process were the same except that the alloy formation of the surface layer of Exemplary Embodiment 2 was different from that of Exemplary Embodiment 1.

Comparative Example 1

A cold-rolled Invar base metal plate was prepared.

Thereafter, a photoresist layer including a plurality of open regions was formed on one surface of the Invar base metal plate. Thereafter, an etching process was performed only on a surface in which the photoresist layer including a plurality of open regions was formed.

In this manner, one surface hole of a first surface hole and a second surface hole was formed under the open region of the photoresist layer.

In Comparative Example 1, a thickness of the base metal plate was the same as those in Exemplary Embodiments 1 and 2, and conditions of an etching process were also the same as those in Exemplary Embodiments 1 and 2.

A difference between the average diameter of the open region of the photoresist layer according to Exemplary Embodiments 1 and 2 and the average diameter of the surface hole formed under the open region was measured to be smaller than a difference between the average diameter of the open region of the photoresist layer according to Comparative Example 1 and the average diameter of the surface hole formed under the open region.

The average diameter of the open region of the photoresist layer and the average diameter of the surface hole according to Exemplary Embodiments 1 and 2 were measured to be 1:1.5 or less. Specifically, the average diameter of the open region of the photoresist layer and the average diameter of the surface hole according to Exemplary Embodiments 1 and 2 were measured to be 1:1.1 to 1:1.4.

The average diameter of the open region of the photoresist layer and the average diameter of the surface hole according to Comparative Example 1 were measured to be 1:1.7 or more. Specifically, the average diameter of the open region of the photoresist layer and the average diameter of the surface hole according to Comparative Example 1 were measured to be 1:1.7 to 1:1.8.

Figure 16:
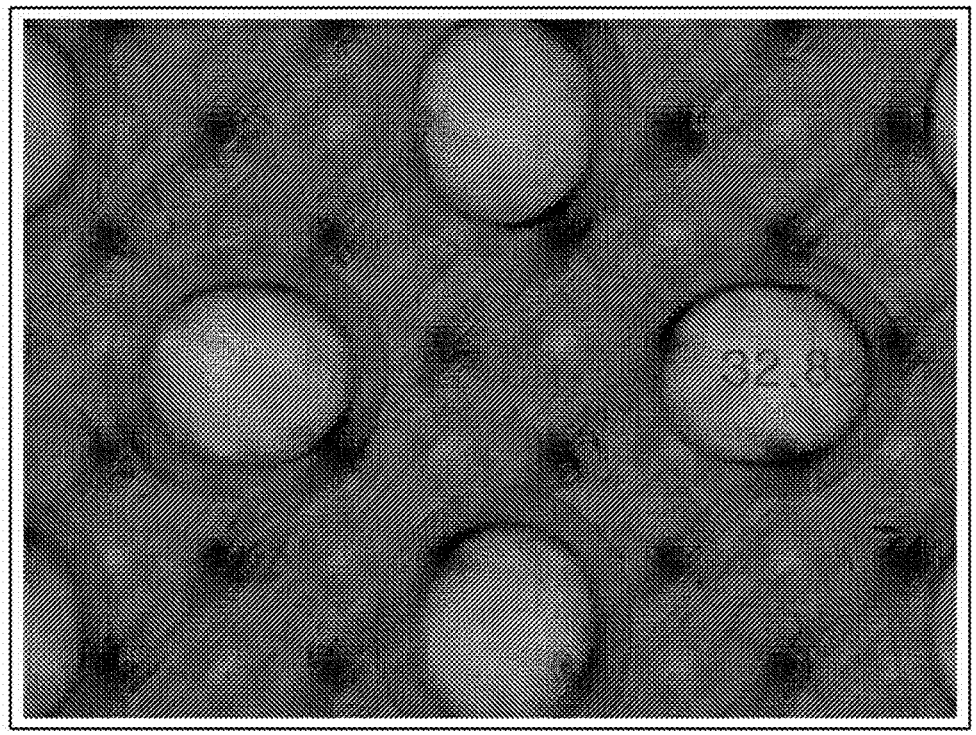
FIG. 16 is a photograph of a surface hole of a metal plate according to an embodiment.
Figure 17:
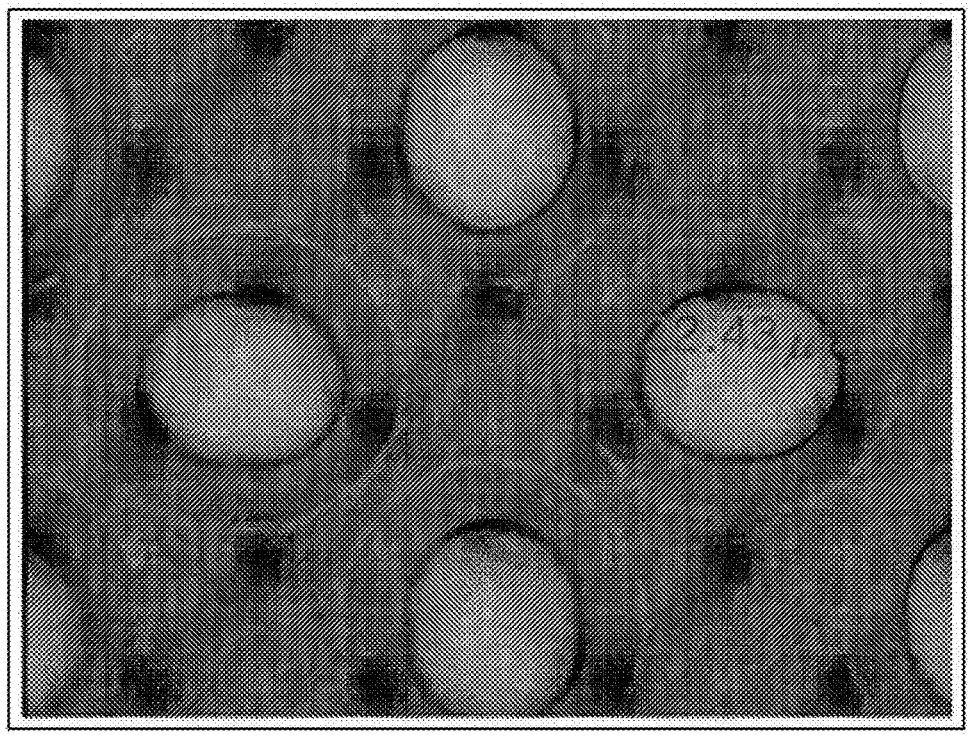
FIG. 17 is a photograph of a surface hole of a metal plate according to a comparative example.

FIGS. 16 and 17 are photographs of surface holes formed by Exemplary Embodiment 1 and Comparative Example 1.

Referring to FIG. 16, a diameter of an open region of an arbitrary photoresist layer formed according to Exemplary Embodiment 1 is 23.8 μm, and a diameter of an arbitrary surface hole disposed under the open region of the photoresist layer is 32.85 μm.

Meanwhile, referring to FIG. 17, a diameter of an open region of an arbitrary photoresist layer formed according to Comparative Example 1 is 22.43 μm, and a diameter of an arbitrary surface hole disposed under the open region of the photoresist layer is 39.15 μm.

It was confirmed that the etching characteristics of the through-hole were excellent by satisfying the ratio of the average diameter of the open region of the photoresist layer and the average diameter of the surface hole according to Exemplary Embodiments 1 and 2 to 1:1.4 or less. In addition, it was confirmed that the deposition mask according to the embodiment may include through-holes with improved uniformity, and uniformity of a pattern shape deposited through the same is improved.

Experimental Example 2: Evaluation of Etching Factor

TABLE 1

| | Exemplary Embodiment 1 | Exemplary Embodiment 2 | Comparative Example 1 |
|---|---|---|---|
| Etching factor | 2.5 | 2.7 | 1.7 |

Table 1 shows etching factors according to Exemplary Embodiment 1, Exemplary Embodiment 2 and Comparative Example 1.

It can be seen that etching factors of deposition masks according to Exemplary Embodiments 1 and 2 are 2.5 or more. For example, it can be seen that the etching factors of the deposition masks according to Exemplary Embodiments 1 and 2 are 2.5 to 2.7. Accordingly, it can be seen that the deposition mask according to the embodiment may prevent a photoresist layer from de-filming in an etching process, and etching characteristics of a surface hole or through-holes is excellent.

On the other hand, it can be seen that an etching factor of a deposition mask according to Comparative Example 1 is less than 2.0. Specifically, it can be seen that the etching factor of the deposition mask according to Comparative Example 1 is 1.7. Accordingly, it can be seen that in the deposition mask according to Comparative Example 1, de-filming of a photoresist layer may occur in an etching process, and etching characteristics of a surface hole or through-holes is deteriorated.

An etch rate refers to an amount etched per unit time.

A cold-rolled Invar base metal plate according to Comparative Example 1 has an etch rate of an outer surface similar to that of an inside thereof. Even when a cold rolling process is performed, the outer surface and the inside thereof have the same compositions, and since a crystal structure of the outer surface and the inside thereof are the same or similar, it can be seen that it is difficult to improve the etching characteristics only with the Invar material itself.

On the other hand, Exemplary Embodiments 1 and 2 may include first and second surface layers capable of improving the etching factor to 2.5 or more. The metal surface layer of Exemplary Embodiment 1 is a binary alloy containing chromium which may slow the etch rate than the base metal plate. The metal surface layer of Exemplary Embodiment 2 is a ternary alloy containing chromium which may slow the etch rate than the base metal plate.

The metal surface layer according to Exemplary Embodiments 1 and 2 may contain an element different from that of the base metal plate, as an example, a metal element excellent in corrosion resistance such as Cr. Accordingly, it can be seen that the etch rate of the metal surface layer according to Exemplary Embodiments 1 and 2 is slower than that of the base metal plate. Accordingly, the metal plate according to the embodiment may form fine through-holes.

The etch rate of the surface layer may be slower than that of the base metal plate. That is, the etch rate of the base metal plate may be relatively faster than that of the surface layer. That is, when etching a base layer of the metal plate, the etch rate may be relatively slow in a side surface direction of the surface layer (direction A1, A2 in FIG. 18), and the etch rate in a depth direction of the base metal plate (direction B in FIG. 18) may be relatively fast. Therefore, the etch factor of the embodiment may be increased, and it is possible to form fine through-holes. The etch rate of the surface layer and the etch rate of the base metal plate may be confirmed by measuring an amount etched per time while etching the metal plate. When the measurement is performed in this manner, it can be confirmed that the etched amount is relatively small at a time when the surface layer is etched and the etched amount is relatively large at a time when the base metal plate is etched.

FIG. 18 is a cross-sectional view of a surface hole according to Exemplary Embodiment 1.

Referring to FIG. 18, when an etching factor is 2.5 or more, a width of a surface hole may be small and the etching characteristics may be excellent in a depth direction. In addition, when the etching factor is 2.5 or more, a contact area of a bridge region BR positioned between a photoresist layer and an adjacent through-hole may be large, thereby stably preventing de-filming of the photoresist layer. Accordingly, it is possible to form a fine deposition pattern through the deposition mask according to the embodiment.

Figure 19:
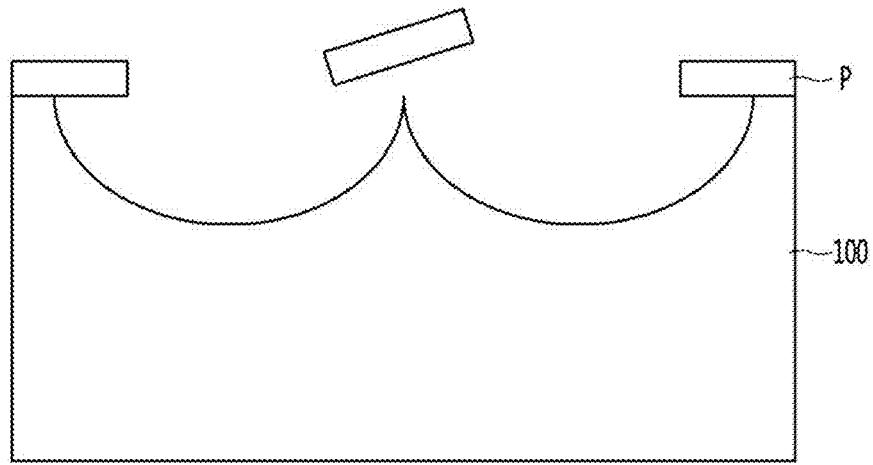
FIG. 19 is view illustrating a cross-sectional view in an etching process of a comparative example.

FIG. 19 is a cross-sectional view of a surface hole according to Comparative Example 1.

Figure 20:
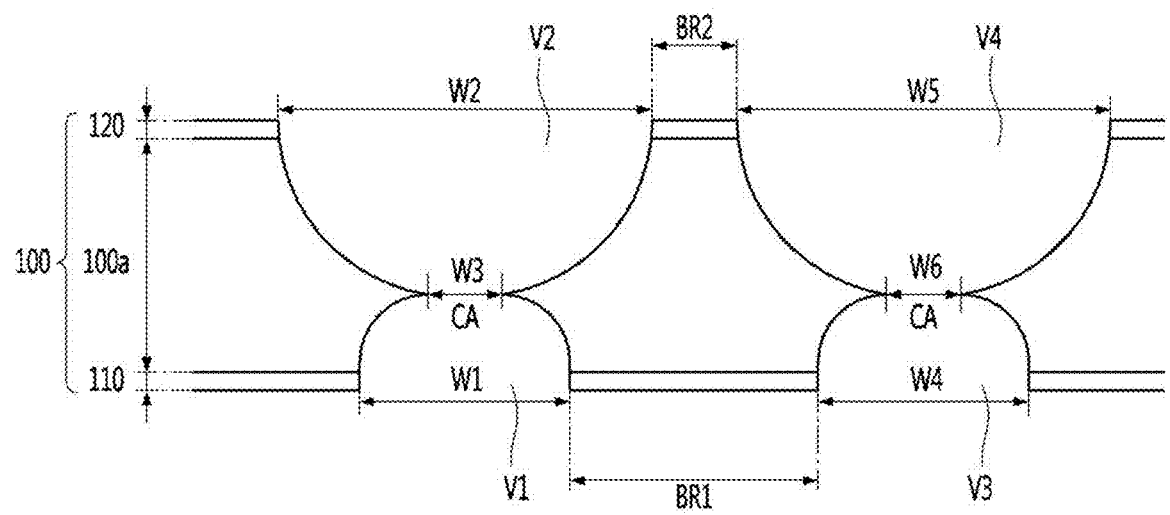
FIGS. 20 and 21 are views of a second embodiment illustrating a cross-sectional view taken along a line A-A' in FIG. 9.

Referring to FIG. 20, since a surface hole according to Comparative Example 1 has an etching factor of 1.7, an adjacent through-hole may be overlapped. Alternatively, a de-filming phenomenon of the photoresist layer may occur. Accordingly, in Comparative Example 1, it can be seen that the manufacturing yield and process efficiency of the through-hole are deteriorated.

A deposition mask according to an embodiment includes a metal plate, a base metal plate including a first surface and a second surface facing each other, a first surface layer disposed on the first surface, and a second surface layer disposed on the second surface, wherein the metal plate includes a plurality of through-holes, and an etching factor of the metal plate may be 2.5 or more.

In the deposition mask according to the embodiment, a metal surface layer may be disposed on the base metal plate before forming the through-hole. Accordingly, the surface layer may be opened without being disposed on a region in which the through-hole is disposed.

An inner region of the through-hole may include an element different from that of the surface layer. In addition, although the inner region of the through-hole includes the same element as that of the surface layer, composition of an included element may be different. Accordingly, an etch rate of the metal surface layer may be lowered.

That is, in the deposition mask according to the embodiment, the etch rate of the base metal plate may be faster than that of the metal surface layer in an etching process for forming the through-hole, so that etching efficiency may be improved and uniformity of the through-hole may be improved.

In addition, an OLED panel manufactured by the deposition mask according to the embodiment has excellent pattern deposition efficiency, and may improve deposition uniformity.

Figure 21:
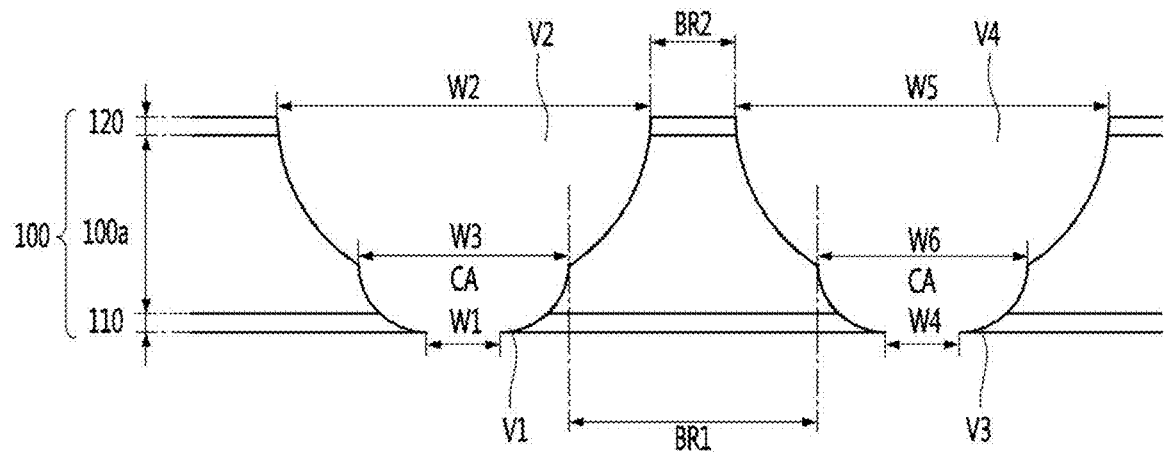

With reference to FIGS. 20 and 21, a deposition mask according to a second embodiment will be described.

Features of the first and second embodiments may be combined and applied except for a case which is inconsistent with a feature of the first embodiment. A description overlapped with the first embodiment described above may be omitted. The same reference numerals may be assigned to the same elements.

Referring to FIGS. 20 and 21, the metal plate included in the deposition mask according to the second embodiment may include a base metal plate 100a and a metal surface layer.

The metal surface layer may be disposed on one or both surfaces of the base metal plate 100a.

A first surface layer 110 may be disposed on one surface of the base metal plate 100a and a second surface layer 120 may be disposed on the other surface opposite to the one surface.

The metal plate for the deposition mask may include the first surface layer 110 and the second surface layer 120 on both surfaces of the base metal plate 100a. The base metal plate 100a may be disposed in a sandwich structure between the first surface layer 110 and the second surface layer 120.

The base metal plate 100a may include a different material from that of the surface layer. The base metal plate 100a may include a different element from that of the first surface layer 110. In addition, the base metal plate 100a may include a different element from that of the second surface layer 120.

In addition, the base metal plate 100a may have a composition ratio different from those of the first and second metal surface layers 110 and 120.

In an embodiment, the first surface layer 110 and the second surface layer 120 include a different element from that of the base metal plate 100a, so that the corrosion rate of the first and second surface layers may be slower than that of the base metal plate. That is, the corrosion rate of the base metal plate 100a which is a bulk metal plate may be faster than the corrosion rate of the metal surface layer. Accordingly, the etching factor of the deposition mask according to the embodiment may be increased. In addition, since the deposition mask according to the embodiment may uniformly form a plurality of through-holes, the deposition efficiency of R, G, and B patterns may be improved.

The surface layer may include various elements corresponding to primary ionization energy of 450 to 850 kj/mol such as Nb, V, In, Sb, etc., in addition to metal elements such as Ni, Cr, Mo, Mn, Ti, Co, Cu, Fe, and Ag.

The surface layer may include at least one element of Ni, Cr, Mo, Mn, Ti, Co, Cu, Fe, Au, Al, Mg, O, Ca, Cr, Si, Ti, Ag, Nb, V, In, and Sb. For example, the surface layer may be a binary layer including two different elements of Ni, Cr, Mo, Mn, Ti, Co, Cu, Fe, Au, Al, Mg, O, Ca, Cr, Si, Ti, Ag, Nb, V, In, and Sb. For example, the surface layers 100b and 100c may be a ternary layer including three different elements of Ni, Cr, Mo, Mn, Ti, Co, Cu, Fe, Au, Al, Mg, O, Ca, Cr, Si, Ti, Ag, In, and Sb. For example, the surface layer may be a layer including four or more different elements of Ni, Cr, Mo, Mn, Ti, Co, Cu, Fe, Au, Al, Mg, O, Ca, Cr, Si, Ti, Ag, Nb, V, In, and Sb.

The surface layer may include at least one element of Al, Mg, O, Ca, Cr, Si, and Mn. As an example, the surface layer may be a metal oxide layer. At this time, the surface layer may be a surface layer formed by a separate sputtering process or the like, which is not a natural oxide film which may be formed to 5 nm or less during transfer after a rolling process of the base metal plate. As an example, the surface layer may be a chromium layer or a chromium alloy layer.

At this time, the chromium content (wt %) of the surface layer may be larger than the chromium content (wt %) of the base metal layer. The surface layer may delay the corrosion rate on the surface of the metal plate used for the deposition mask. Accordingly, the deposition mask according to the embodiment may improve the etching factor.

A thickness of the base metal plate 100a may be greater than a thickness of the surface layer. The thickness of the base metal plate 100a may be greater than the thickness of at least one of the first surface layer 110 and the second surface layer 120.

The thickness of the base metal plate 100a may be 30 μm or less. For example, the thickness of the base metal plate 100a may be 1 μm to 30 μm. For example, the thickness of the base metal plate 100a may be 5 μm to 19.9 μm. For example, the thickness of the base metal plate 100a may be 15 μm to 19.5 μm. For example, the thickness of the base metal plate 100a may be 10 μm to 19.8 μm. When the thickness of the base metal plate 100a exceeds 30 μm, a distance (pitch) between adjacent through-holes may be increased. Accordingly, efficiency of forming a display device with high definition or ultra high definition may be deteriorated. Since the base metal plate of the embodiment may have a thickness of 20 μm or less, the distance (pitch) between adjacent through-holes may be decreased. Therefore, it may be suitable to provide a display device with high definition and/or ultra high definition. That is, the deposition mask according to the embodiment may increase pixels per inch (PPI).

The first surface layer 110 and the second surface layer 120 may have a thickness corresponding to each other. Here, the "corresponding" may include an error due to tolerance.

The surface layer may be 0.5 nm to 1000 nm or less on one surface or both surfaces of the base metal plate. The surface layer may be disposed at a thickness of 5 nm to 850 nm or less on the one surface or the both surfaces of the base metal plate. The surface layer may be disposed at a thickness of 10 nm to 600 nm or less on the one surface or the both surfaces of the base metal plate.

The thickness of the first surface layer 110 may be 20 nm to 500 nm. For example, the thickness of the first surface layer 110 may be 20 nm to 50 nm. For example, the thickness of the first surface layer 110 may be 25 nm to 35 nm.

The thickness of the second surface layer 120 may be 20 nm to 500 nm. For example, the thickness of the second surface layer 120 may be 20 nm to 50 nm. For example, the thickness of the second surface layer 120 may be 25 nm to 35 nm.

When the thickness of the surface layer is less than 1 nm, the effect of improving the etching factor by the metal surface layer may be reduced, and thus uniformity of the through-hole may be deteriorated. That is, when the thickness of the surface layer is less than 1 nm, a through-hole having a large variation in thickness and/or width is formed, so that the pattern formed by the metal plate having the through-hole may not be uniform, and thus manufacturing efficiency of the display device may be deteriorated.

In addition, when the thickness of the surface layer is less than 1 nm, it may be difficult to form a through-hole having a fine size.

When the thickness of the surface layer exceeds 1 μm, manufacturing efficiency may be deteriorated. An interface between the base metal plate 100a and the surface layer may include a cationic or anionic material. The base metal plate 100a may have a thin thickness of 20 μm or less by an acid etchant. Accordingly, the surface of the base metal plate 100a may include a cation such as a proton (H+) of an acidic solution or an anion of a conjugate base by dissociation of an acidic solution. As an example, the interface between the base metal plate 100a and the surface layer may include in 0.1 wt % or less any one ion of Cl—, HSO4-, H2PO4-, and CH3CO2- by dissociation of an acidic solution such as hydrochloric acid, sulfuric acid, phosphoric acid, and acetic acid. However, since the acidic solution may be removed by washing with water, substantially few cations such as proton (H+) or anions of the conjugate base due to dissociation of the acidic solution may be remained. Here, substantially few remaining may mean that the cation such as proton (H+) or the anion of the conjugate base due to dissociation of the acidic solution is detected to be 0.01 wt % or less.

The base metal plate 100a may include a surface etched with an acidic solution. The base metal plate 100a may have a larger roughness than the metal plate including the rolled surface. Specifically, the base metal plate 100a may have a greater arithmetic mean roughness (Ra) and ten-point mean roughness (Rz) than the rolled Invar metal plate.

The arithmetic mean roughness (Ra) of the base metal plate 100a measured at the interface between the base metal plate and the surface layer may be more than 50 nm. For example, the arithmetic mean roughness (Ra) of the base metal plate 100a measured at the interface between the base metal plate and the surface layer may be 50 nm<Ra<300 nm. For example, the arithmetic mean roughness (Ra) of the base metal plate 100a measured at the interface between the base metal plate and the surface layer may be 50 nm<Ra<200 nm. For example, the arithmetic mean roughness (Ra) of the base metal plate 100a measured at the interface between the base metal plate and the surface layer may be 70 nm<Ra<150 nm.

The ten-point mean roughness (Rz) of the base metal plate 100a measured at the interface between the base metal plate and the surface layer may be more than 800 nm. For example, the ten-point mean roughness (Rz) of the base metal plate 100a measured at the interface between the base metal plate and the surface layer may be 800 nm<Rz<2500 nm. For example, the ten-point mean roughness (Rz) of the base metal plate 100a measured at the interface between the base metal plate and the surface layer may be 800 nm<Rz<2000 nm. For example, the ten-point mean roughness (Rz) of the base metal plate 100a measured at the interface between the base metal plate and the surface layer may be 800 nm<Rz<1500 nm.

The roughness of one surface of the first surface layer 110 which is in direct contact with the base metal plate 100a may be larger than that of the other surface opposite to the one surface of the first surface layer 110 forming the surface of the metal plate for the deposition mask. Accordingly, the interface between the base metal plate 100a and the first surface layer 110 may have excellent adhesion characteristics. In addition, since the roughness of the other surface of the first surface layer 110 forming the surface of the metal plate for the deposition mask may be smaller than that of the one surface, etching quality may be improved.

The roughness of one surface of the second surface layer 120 which is in direct contact with the base metal plate 100a may be larger than that of the other surface opposite to the one surface of the second surface layer 120 forming the surface of the metal plate for the deposition mask. Accordingly, the interface between the base metal plate 100a and the second surface layer 120 may have excellent adhesion characteristics. In addition, since the roughness the other surface of the second surface layer 120 forming the surface of the metal plate for the deposition mask may be smaller than that of the one surface, etching quality may be improved.

In addition, the base metal plate may form the through-hole and remove the surface layer. In this case, the arithmetic mean roughness (Ra) measured on the surface of the base metal plate from which the surface layer has been removed may be more than 50 nm.

The deposition mask 100 may have different widths of through-holes along the thickness direction of the through-hole.

Referring to FIG. 20, a width W1 of the first surface hole V1 may be greater than a width W3 of the connecting part CA. Specifically, the width of the through-hole may be reduced as the first surface hole V1 goes from the first surface 101 toward the connecting part CA. More specifically, the width of the through-hole may be gradually reduced as the first surface hole V1 goes from the first surface 101 toward the connecting part CA.

A width W2 of the second surface hole V2 may be greater than the width W3 of the connecting part CA. Specifically, the width of the through-hole may be reduced as the second surface hole V2 goes from the second surface 102 toward the connecting part CA. More specifically, the width of the through-hole may be gradually reduced as the second surface hole V2 goes from the second surface 102 toward the connecting part CA.

Since a third surface hole V3 adjacent to the first surface hole V1 and formed on the first surface 101 communicates with a fourth surface hole V4 adjacent to the second surface hole V1 and formed on the second surface 102, through the connecting part CA, a through-hole may be formed.

A width W5 of the fourth through-hole V4 may be greater than a width W4 of the third through-hole V3. For example, the width W4 of the third through-hole V3 may be greater than a width W6 of the connecting part CA. Specifically, the width of the through-hole may be reduced as the third surface hole V3 goes from the first surface 101 toward the connecting part CA. Specifically, the width of the through-hole may be gradually reduced as the third surface hole V3 goes from the first surface 101 toward the connecting part CA. For example, the width W5 of the fourth surface hole V4 may be greater than the width W6 of the connecting part CA. Specifically, the width of the through-hole may be reduced as the fourth surface hole V4 goes from the second surface 102 toward the connecting part CA. More specifically, the width of the through-hole may be gradually reduced as the fourth surface hole V4 goes from the second surface 102 toward the connecting part CA.

Referring to FIG. 21, a width W1 of the first surface hole V1 may be smaller than a width W3 of the connecting part CA. Specifically, the width of the through-hole may be increased as the first surface hole V1 goes from the first surface 101 toward the connecting part CA. More specifically, the width of the through-hole may be gradually increased as the first surface hole V1 goes from the first surface 101 toward the connecting part CA.

A width W2 of the second surface hole V2 may be greater than the width W3 of the connecting part CA. Specifically, the width of the through-hole may be reduced as the second surface hole V2 goes from the second surface 102 toward the connecting part CA. More specifically, the width of the through-hole may be gradually reduced as the second surface hole V2 goes from the second surface 102 toward the connecting part CA.

Since a third surface hole V3 adjacent to the first surface hole V1 and formed on the first surface 101 communicates with a fourth surface hole V4 adjacent to the second surface hole V1 and formed on the second surface 102, through the connecting part CA, a through-hole may be formed.

A width W5 of the fourth through-hole V4 may be greater than a width W4 of the third through-hole V3. For example, the width W4 of the third through-hole V3 may be smaller than a width W6 of the connecting part CA. Specifically, the width of the through-hole may be increased as the third surface hole V3 goes from the first surface 101 toward the connecting part CA. Specifically, the width of the through-hole may be gradually increased as the third surface hole V3 goes from the first surface 101 toward the connecting part CA. For example, the width W5 of the fourth surface hole V4 may be greater than the width W6 of the connecting part CA. Specifically, the width of the through-hole may be reduced as the fourth surface hole V4 goes from the second surface 102 toward the connecting part CA. More specifically, the width of the through-hole may be gradually reduced as the fourth surface hole V4 goes from the second surface 102 toward the connecting part CA. Accordingly, it is possible to efficiently form a deposition pattern having a fine size Referring to FIGS. 21 and 22, a deposition mask according to an embodiment may include a plurality of through-holes. At this time, a width of one through-hole may be 40 µm or less. For example, the width of the through-hole may be 5 to 40 µm. For example, the width of the through-hole may be 10 to 35 µm. For example, at least one of the width W1 of the first surface hole and the width W2 of the second surface hole may have a width of 40 µm or less. When the width of the through-hole is more than 40 µm, it may be difficult to form a fine deposition pattern.

Since a third surface hole V3 adjacent to the first surface hole V1 and formed on the first surface 101 communicates with a fourth surface hole V4 adjacent to the second surface hole V2 and formed on the second surface 102, through the connecting part CA respectively, a plurality of through-holes may be formed.

A deposition mask according to an embodiment may include a bridge region BR between an arbitrary first through-hole and a second through-hole adjacent to the first through-hole. For example, the first surface 101 between the first surface hole V1 and the third surface hole V3 may include a first bridge region BR1, and the second surface 102 between the second surface hole V2 and the fourth surface hole V4 may include a second bridge region BR2. The first bridge region BR1 may be larger than a plane area of the second bridge region BR2. The bridge region may support a plurality of through-holes to be spaced apart from each other at a predetermined distance.

Figure 22:
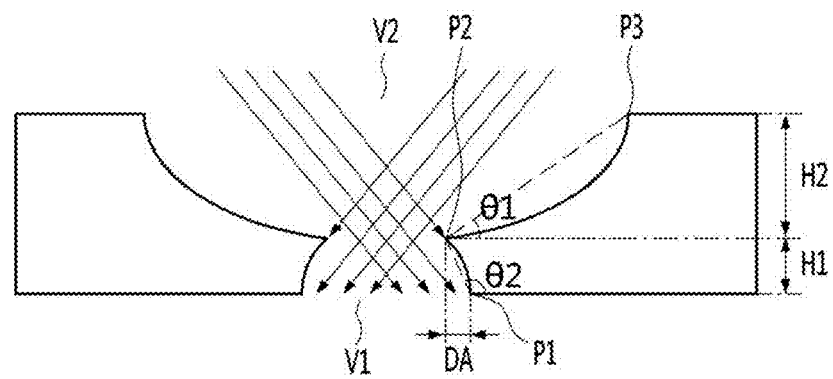
FIG. 22 is view illustrating a deposition mask according to the second embodiment.
Figure 23:
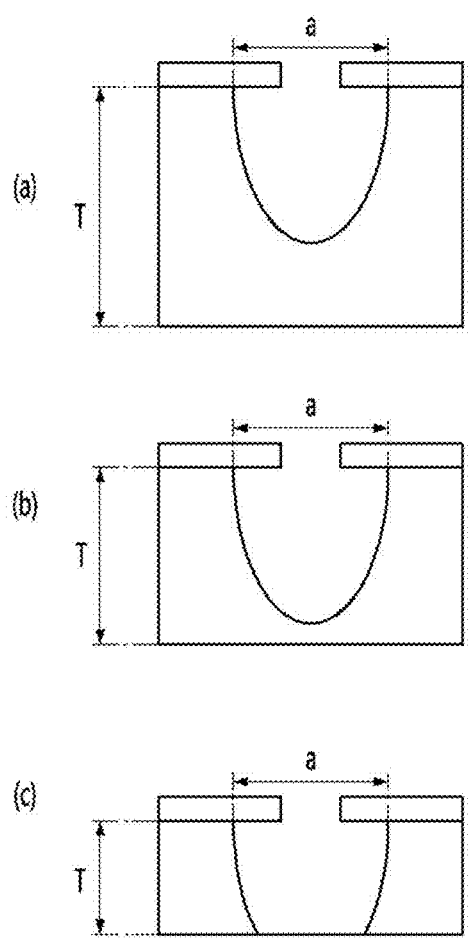
FIG. 23 is a view for explaining easiness of forming a through-hole according to a decrease in thickness of a metal plate for a deposition mask.
Figure 24:
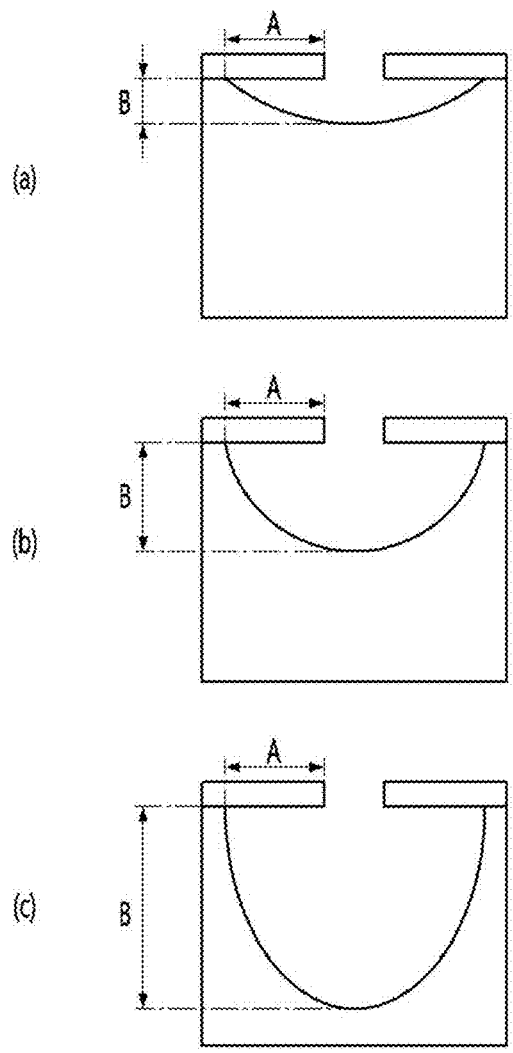
FIG. 24 is a view for explaining easiness of forming a through-hole according to an increase of an etching factor.

With reference to FIGS. 22 to 24, a deposition mask having various sectional structures according to an embodiment will be described.

A deposition mask may include a first surface and a second surface facing each other, and may include an inflection point P2 between a first surface hole V1 on the first surface and a second surface hole V2 on the second surface.

With respect to the inflection point P2, an angle to the first surface hole V1 and an angle to the second surface hole V2 may be different from each other. At this time, an inflection point may be an arbitrary point at an end of a connecting part CA.

Referring to FIG. 22, an inclination angle θ1 of a deposition mask connecting the inflection point P2 to an arbitrary point P3 of an end of the second surface hole V2 may be 90 degrees or less. When the inclination angle connecting the inflection point P2 to the arbitrary point P3 of the end of the second surface hole V2 exceeds 90 degrees, it may be difficult to accommodate a deposition material, and thus deposition efficiency may be deteriorated.

The inclination angle θ1 connecting the inflection point P2 to the arbitrary point P3 of the end of the second surface hole V2 may be in the range of 20 to 70 degrees. When the inclination angle connecting the inflection point P2 to the arbitrary point P3 of the end of the second surface hole V2 is in the range of 20 to 70 degrees, uniformity of the deposition may be improved.

For example, the inclination angle connecting the inflection point P2 to the arbitrary point P3 of the end of the second surface hole V2 may be in the range of 30 to 60 degrees. For example, the inclination angle connecting the inflection point P2 to the arbitrary point P3 of the end of the second surface hole V2 may be in the range of 32 to 38 degrees or 52 to 58 degrees.

An inclination angle between an arbitrary point P1 of an end of the first surface hole V1 and an arbitrary point P3 of an end of the second surface hole V2 may be 70 degrees or less. For example, the inclination angle between the arbitrary point P1 of the end of the first surface hole V1 and the arbitrary point P3 of the end of the second surface hole V2 may be 60 degrees or less. For example, the inclination angle between the arbitrary point P1 of the end of the first surface hole V1 and the arbitrary point P3 of the end of the second surface hole V2 may be 50 degrees or less. Accordingly, it is possible to have an inclination angle capable of accommodating a deposition material well.

An inclination angle θ2 of the deposition mask connecting the inflection point P2 to the arbitrary point P1 of the end of the first surface hole V1 may be more than 90 degrees.

The inclination angle θ2 of the deposition mask connecting the inflection point P2 and the arbitrary point P1 at the end of the first surface hole V1 may be more than 90 degrees and 110 degrees or less.

In addition, the inclination angle θ2 of the deposition mask connecting the inflection point P2 and the arbitrary point P1 at the end of the first surface hole V1 may be 95 degrees or more and 100 degrees or less.

That is, when the inclination angle θ2 of the deposition mask exceeds 110 degrees, the first surface hole which has a larger width than the connecting part may include a shadow region SA. Accordingly, a phenomenon of spreading of a deposition pattern released through the first surface hole may occur. When the inclination angle θ2 of the deposition mask is less than 90 degrees, the deposition material may be separated from the deposition substrate when the mask is removed after deposition through the mask.

In order to solve the problem that it is difficult to provide a display device with high definition and/or ultra high definition by forming a deposition pattern greater than a width of a connecting region in the deposition mask according to the embodiment, an entire thickness of the metal plate for the deposition mask may be formed to 20 μm or less. In addition, as a height H1 of the first surface hole is larger, the deposition pattern spreads, so that the height H1 of the first surface hole may be formed to 5 μm or less. For example, the height H1 of the first surface hole may be 3 μm or less. Meanwhile, a height H2 of the second surface hole V2 may be larger than the height H1 of the first surface hole V1. Further, in the embodiment, it is possible to form a fine deposition pattern by forming a metal surface layer on the metal plate for the deposition mask and increasing an etching factor.

With reference to FIG. 23, easiness of forming a through-hole by forming a metal plate for a deposition mask to be 20 μm or less will be described.

FIGS. 23(a), 23(b) and 23(c) are views explaining whether to form a through-hole by etching when a thickness T of a metal plate for a deposition mask is changed.

When etching is performed for the same time by making a width of an open region of a photoresist layer constant and using a metal plate of the same material, it can be seen that a through-hole is not formed in FIGS. 23(a) and 23(b) in which a thickness of the metal plate for the deposition mask is large. On the other hand, it can be seen that the through-hole is formed in FIG. 23(c) in which the thickness of the metal plate for the deposition mask is small. That is, the metal plate for the deposition mask according to the embodiment may have a thin thickness of 20 μm or less, and the through-hole having a fine size may be formed quickly, so that a manufacturing process may be improved.

Referring to FIG. 24, easiness of forming a fine through-hole by increasing an etching factor will be described.

FIGS. 24(a), 24(b), and 24(c) are views explaining whether to form a through-hole by etching when a depth (b) in a center direction of an etched surface hole is changed. FIGS. 24 (a), 24 (b), and 24 (c) are views showing a change of an etching factor by making a width of an open region of a photoresist layer constant and using a metal plate of the same material.

FIG. 24(a) is view illustrating that the etching factor is 0.5 as a width (a) of one end extending from a bridge region of an opened photoresist layer and protruding toward a center of the surface hole and the depth (b) in a center direction of an etched surface hole are in a ratio of 1:0.5.

$$\text{Etching Factor} = B/A \qquad \text{Equation 1}$$

In the Equation 1, the B is a depth in a center direction of an etched surface hole.

The A is a width of one end extending from a bridge region of an opened photoresist layer and protruding toward a center direction of the surface hole.

FIG. 24(b) is view illustrating that the etching factor is 1.0 as a width (a) of one end extending from a bridge region of an opened photoresist layer and protruding toward a center of the surface hole and the depth (b) in a center direction of an etched surface hole are in a ratio of 1:1.

FIG. 24(c) is view illustrating that the etching factor is 2.0 as a width (a) of one end extending from a bridge region of an opened photoresist layer and protruding toward a center of the surface hole and the depth (b) in a center direction of an etched surface hole are in a ratio of 1:2.

Referring to FIGS. 24(a), 24(b), and 24(c), it can be seen that a fine sized through-hole is formed as an etching factor increases in a depth of the same metal plate. That is, a deposition mask for manufacturing a display device with high definition and/or ultra high definition should increase the depth (b) in a center direction of an etched surface hole. To this end, the metal plate for the deposition mask according to an embodiment may include a metal surface layer on a base metal plate.

The etching factor of the deposition mask according to the embodiment may be 1.2 or more. The etching factor of the deposition mask according to the embodiment may be 1.5 or more. The etching factor of the deposition mask according to the embodiment may be 1.6 or more. The etching factor of the deposition mask according to the embodiment may be 2.0 or more. Accordingly, the deposition mask according to the embodiment may have a resolution of 600 PPI or more. For example, the deposition mask according to the embodiment may have a resolution of 700 PPI or more. For example, the deposition mask according to the embodiment may have a resolution of 800 PPI or more.

FIGS. 25 to 30 are views illustrating a manufacturing process of a deposition mask according to FIG. 22.

A deposition mask according to an embodiment may be manufactured by including: preparing a base metal plate; forming a surface layer to dispose a metal surface layer on the base metal plate; forming a photoresist layer to dispose a photoresist layer opened on the surface layer; and etching to form a surface hole at a position corresponding to the opened photoresist layer.

Figure 25:
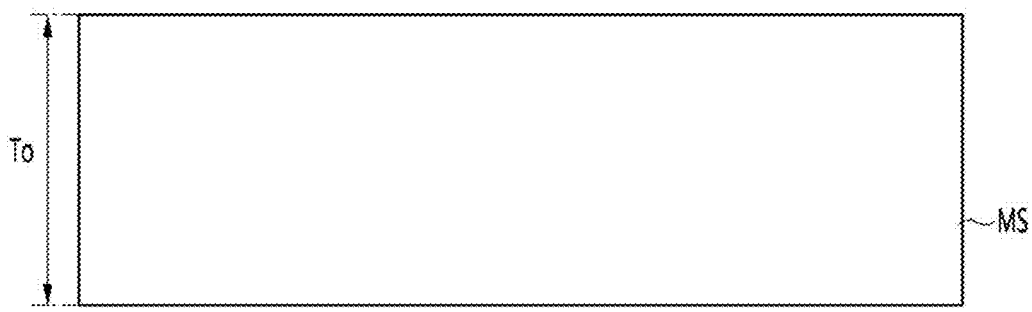
FIGS. 25 to 30 are views illustrating a manufacturing process of a deposition mask according to FIG. 22.

First, with reference to FIG. 25, a preparing step of a metal substrate will be described. A metal substrate MS may include a metal material. The metal substrate MS may include a nickel alloy. For example, the metal substrate MS may be an alloy of nickel and iron. At this point, the nickel may be about 35 to 37 wt %, and the iron may be about 63 to 65 wt %. For example, the metal substrate MS may include Invar including about 35 to 37 wt % of nickel, about 63 to 65 wt % of iron, and at least one of a trace amount of C, Si, S, P, Cr, Mo, Mn, Ti, Co, Cu, Fe, Ag, Nb, V, In, and Sb.

A thickness To of the metal substrate MS may be more than 20 μm. For example, the thickness To of the metal substrate MS may be 30 μm or less. Specifically, the thickness To of the metal substrate MS may be 25 μm or less. Accordingly, a thickness of the base metal plate 100a may be manufactured to be 20 μm or less.

Alternatively, the thickness To of the metal substrate MS may be 20 μm or less. Accordingly, the thickness of the base metal plate 100a may be manufactured to be 15 μm or less.

The preparing step of the base metal plate may include various thickness reduction steps. For example, the base metal plate may further include a thickness reduction step by chemical or electrical treatment. That is, the preparing step of the base metal plate may include treating the metal substrate MS having a thickness of more than 20 μm to a base metal plate having a thickness of 20 μm or less.

Figure 26:
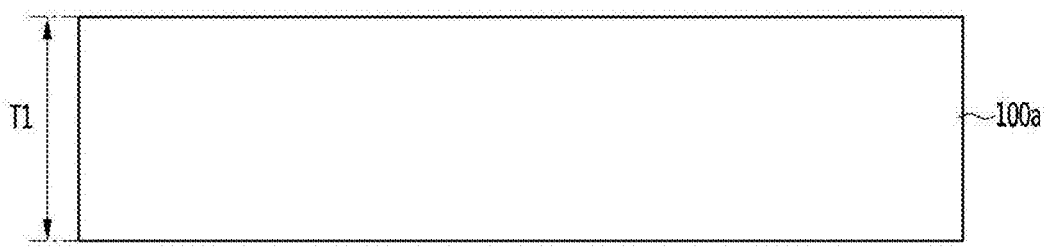

With reference to FIG. 26, a forming step of a base metal plate will be described.

Since the metal substrate MS is treated by a chemical or electrical method, a thickness of the base metal plate may be decreased by a range of about 15% to about 25% compared with that of the metal substrate MS.

Since the metal substrate MS is etched by a chemical agent, a base metal plate 100a having a thickness decreased by about 20% compared with that of the metal substrate MS may be formed. At this time, the chemical agent is an acidic solution, and may be various organic acid solutions or various inorganic acid solutions. Alternatively, since the metal substrate MS is electrically electrolyzed, a base metal plate 100a having a thickness decreased by about 20% compared with that of the metal substrate MS may be formed.

That is, the base metal plate 100a according to an embodiment may be manufactured without using a rolling method. In order to manufacture a display device with ultra high definition, an Invar having a thickness of 20 μm or less should be provided. A thick raw material may be processed into a thin Invar by a repetitive rolling process, but there is a problem that the process difficulty is high and the process cost is high. In order to solve such a problem, the Invar may be processed into a thin thickness by the chemical or electrical method. Accordingly, a thickness T1 of a non-rolled base metal plate 100a may be 20 μm or less. For example, the thickness T1 of the non-rolled base metal plate 100a may be 15 μm or less.

Figure 27:
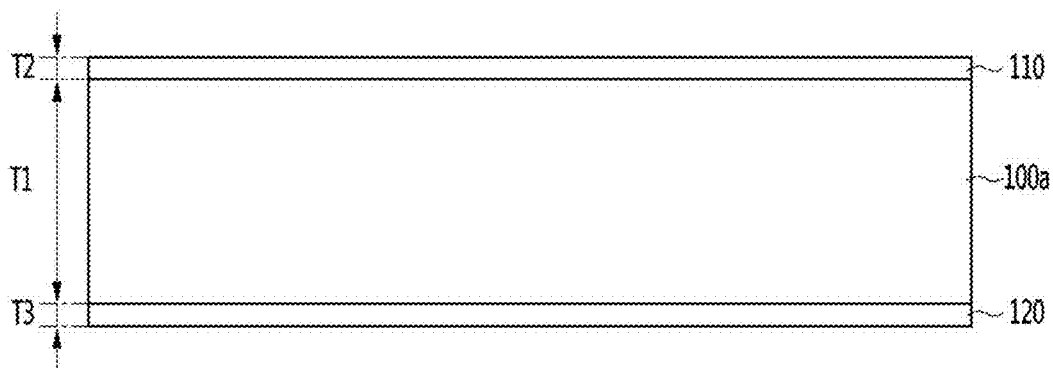

With reference to FIG. 27, a forming step of a metal surface layer will be described.

Since a surface of the base metal plate 100a is processed by the chemical or electrical treatment, an etching factor is deteriorated. That is, the surface of the base metal plate 100a is deformed so as to have a large roughness by chemical or electrical treatment, so that the etching factor may be deteriorated.

Accordingly, a metal surface layer may be formed on one or both surfaces of the base metal plate 100a. For example, when a first surface hole and a second surface hole are formed by double-sided etching of a metal plate, a first surface layer 110 and a second surface layer 120 may be formed on the both surfaces of the base metal plate 100a.

Figure 32:
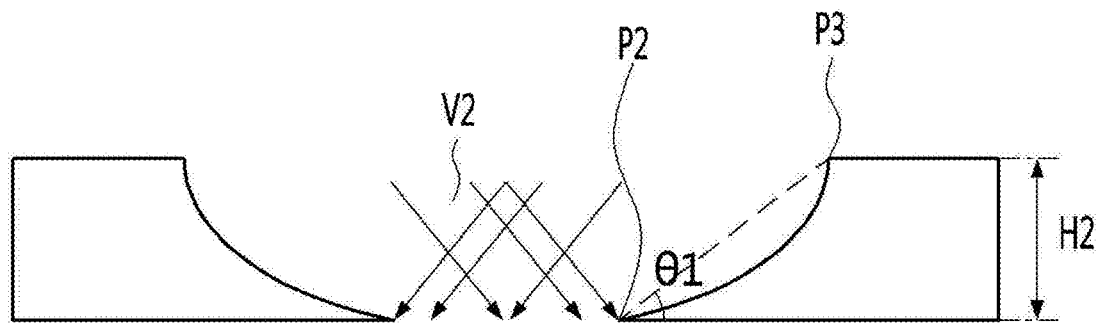
FIG. 32 is still another view illustrating a through-hole of a deposition mask according to the second embodiment.

Alternatively, as shown in FIG. 32, when only a second surface hole is formed by etching of one surface of the metal plate, a metal surface layer may be formed on one surface of the base metal plate 100a.

The surface layer may be various materials capable of improving an etching factor. The surface layer may be various materials for providing an etching factor of 1.2 or more. The surface layer may be various materials for providing an etching factor of 1.5 or more. The surface layer may be various materials for providing an etching factor of 1.6 or more. The surface layer may be various materials for providing an etching factor of 2.0 or more.

The surface layer may be formed to be 1 μm or less. The surface layer may be formed to be 100 nm or less. The surface layer may be formed to be 50 nm or less. The surface layer may include at least one element of Al, Mg, O, Ca, Cr, Si, and Mn.

A thickness T2 of the first surface layer 110 may be 1 nm to 100 nm. The thickness T2 of the first surface layer 110 may be 1 nm to 50 nm.

A thickness T3 of the second surface layer 120 may be 1 nm to 100 nm. The thickness T3 of the second surface layer 120 may be 1 nm to 50 nm.

That is, an adhesion force of the surface layer to the photoresist layer may be different depending on a contained element, and the etching factor may be different. Therefore, it may have various optimum thicknesses in a range of 1 nm to 100 nm depending on the element contained in the metal surface layer.

The surface layer may be formed by various methods such as deposition, electroplating, a solution process and the like. For example, the surface layer may be formed in a deposition process to form a thin film shape. Alternatively, the surface layer may be formed by plating in order to be manufactured thicker than the deposition process. Alternatively, the surface layer may be formed by treating with a solution containing nano or micro particles. In addition, the surface layer may oxidize the base metal plate to increase the etching factor.

Figure 28:
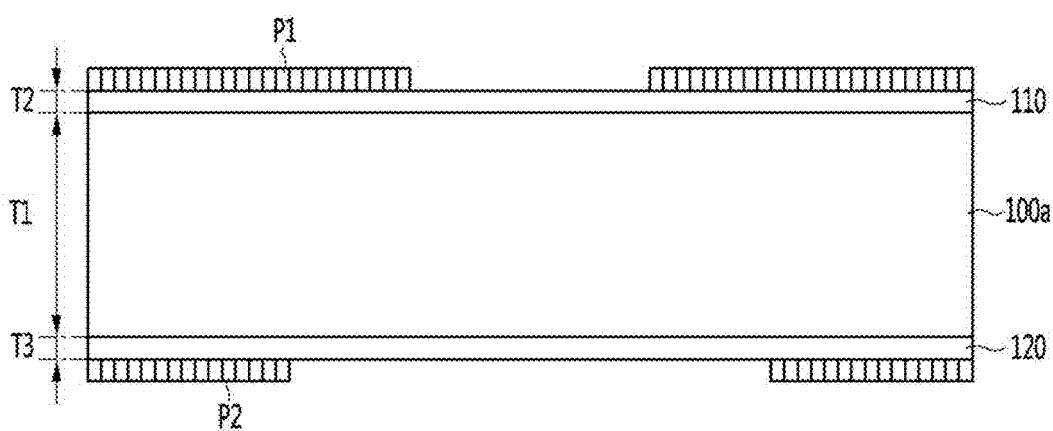

With reference to FIG. 28, a forming step of a photoresist layer will be described.

A first photoresist layer P1 may be disposed on the first surface layer 110, and a second photoresist layer P2 may be disposed on the second surface layer 120.

The first photoresist layer P1 having an open region may be disposed on the first surface layer 110, and the second photoresist layer P2 having an open region may be disposed on the second surface layer 120. Specifically, a photoresist material is coated on each of the first surface layer 110 and the second surface layer 120, and the first photoresist layer P1 and the second photoresist layer P2 may be disposed by exposure and developing processes, respectively.

The first photoresist layer P1 and the second photoresist layer P2 are disposed such that the widths of the open regions of the first photoresist layer P1 and the second photoresist layer P2 are different from each other, so that the width of the first surface hole V1 formed on the first surface 101 and the second surface hole V2 formed on the second surface hole 102 may be different.

The first photoresist layer P1 and the second photoresist layer P2 may include a plurality of open regions for simultaneously forming through-holes in a metal plate for a deposition mask.

Figure 29:
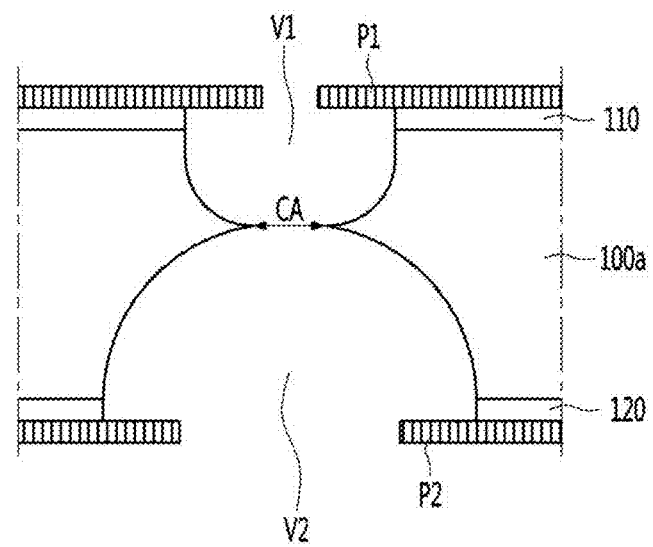

With reference to FIG. 29, an etching step for forming a surface hole will be described.

The first photoresist layer P1 may be partially disposed on the first surface layer 110. Through-holes may not be formed in a region in which the first photoresist layer P1 is disposed on the first surface layer 110. That is, the first photoresist layer P1 may include a substance capable of maintaining physical/chemical stability in the etching process. Accordingly, the first photoresist layer P1 may inhibit etching of the first surface layer 110 and the base metal plate 100a disposed under the first photoresist layer P1.

The second photoresist layer P2 may be partially disposed on the second surface layer 120. Through-holes may not be formed in a region in which the second photoresist layer P2 is disposed on the second surface layer 120. That is, the second photoresist layer P2 may include a substance capable of maintaining physical/chemical stability in the etching process. Accordingly, the second photoresist layer P2 may inhibit etching of the second surface layer 120 and the base metal plate 100a disposed under the second photoresist layer P2.

Meanwhile, the open regions of the first photoresist layer P1 and the second photoresist layer P2 may be etched in the etching process. Accordingly, a through-hole of a metal plate may be formed in the open regions of the first photoresist layer P1 and the second photoresist layer P2.

The first surface hole V1 is formed on a first surface of a metal plate by an etching process, the second surface hole V2 is formed on a second surface opposite to the first surface, and a through-hole may be formed by the first surface hole V1 and the second surface hole V2 being communicated with each other by a connecting part CA.

For example, the etching process may be performed by a wet etching process. Accordingly, since the first surface 101 and the second surface 102 may be simultaneously etched, process efficiency may be improved. As an example, the wet etching process may be performed at about 45° C. by using an etchant containing iron chloride. At this time, the etchant may contain 35 to 45 wt % of FeCl3. Specifically, the etchant may contain 36 wt % of FeCl3. For example, a specific gravity of the etchant containing 43 wt % of FeCl3 may be 1.47 at 20° C. A specific gravity of the etchant containing 41 wt % of FeCl3 may be 1.44 at 20° C. However, an embodiment is not limited thereto, and various etchants may be used.

In the metal plate of a deposition mask, in order to form a through hole passing through the first surface layer 110, the base metal plate 100a, and the second surface layer 120, an etchant may be in contact with a lower surface of the first surface layer 110 and an upper surface of the second surface layer 120. At this time, the first surface layer 110 and the second surface layer 120 may contain a material that is more resistant to the etchant compared with that of the base metal plate 100a, so that an etching factor may be improved.

Figure 30:
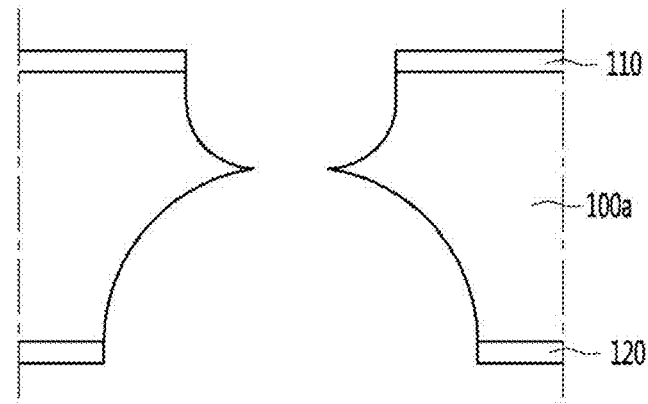

With reference to FIG. 30, a forming step of a deposition mask by removing a photoresist layer will be described. The first surface layer 110 and the second surface layer 120 are disposed on the base metal plate 100a by removing the first photoresist layer P1 and the second photoresist layer P2, and a metal plate having a plurality of through-holes may be formed.

An etching factor of at least one surface of the first surface hole and the second surface hole calculated by the following equation 1 after the etching step, may be 1.2 or more. The etching factor of at least one surface of the first surface hole and the second surface hole calculated by the following equation 1 may be 1.5 or more. The etching factor of at least one surface of the first surface hole and the second surface hole calculated by the following equation 1 may be 1.6 or more. The etching factor of at least one surface of the first surface hole and the second surface hole calculated by the following equation 1 may be 2.0 or more.

An etching factor of a first surface hole and a second surface hole of a deposition mask may be 1.2 or more. The etching factor of the first surface hole and the second surface hole of the deposition mask may be 1.5 or more. The etching factor of the first surface hole and the second surface hole of the deposition mask may be 1.6 or more. The etching factor of the first surface hole and the second surface hole of the deposition mask may be 2.0 or more.

Preferably, the etching factor of the second surface hole larger than the first surface hole may be 1.2 or more. The etching factor of the second surface hole larger than the first surface hole may be 1.5 or more. The etching factor of the second surface hole may be 1.6 or more. The etching factor of the second surface hole may be 2.0 or more.

$$\text{Etching Factor} = B/A \qquad \text{Equation 1}$$

In the equation 1, the B is a depth in a center direction of an etched surface hole.

The A is a width of one end extending from a bridge region of an opened photoresist layer and protruding toward a center of the surface hole.

In addition, a deposition mask according to an embodiment may have a thickness of 20 μm or less. Accordingly, the deposition mask according to the embodiment may provide a display device with high definition and ultra high definition.

The deposition mask according to the embodiment may have various structures.

The inclination angle of the first surface hole according to the embodiment may be variable.

Figure 31:
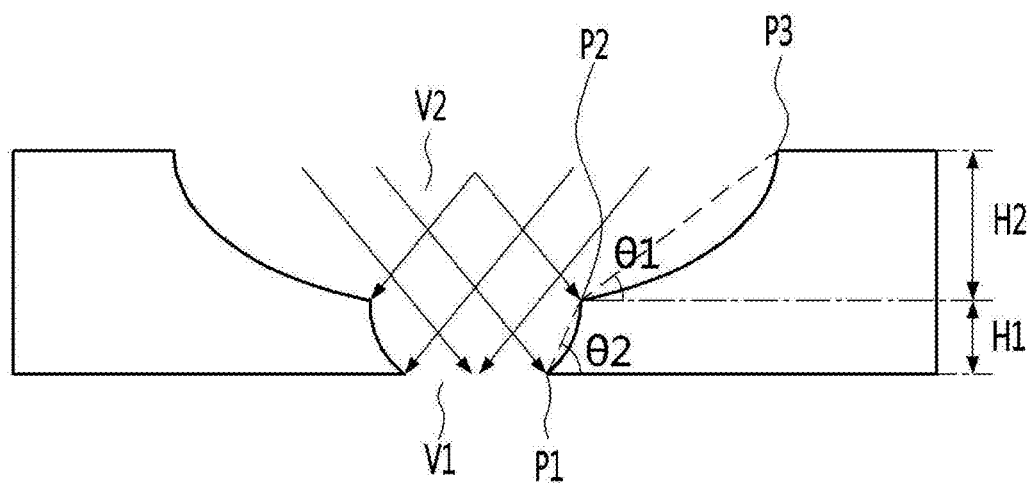
FIG. 31 is another view illustrating a through-hole of a deposition mask according to a second embodiment.

Referring to FIG. 31, an inclination angle $\theta 1$ of a deposition mask connecting the inflection point P2 to an arbitrary point P3 of an end of the second surface hole V2 may be 90 degrees or less. When the inclination angle connecting the inflection point P2 to the arbitrary point P3 of the end of the second surface hole V2 exceeds 90 degrees, it may be difficult to accommodate a deposition material, and thus deposition efficiency may be deteriorated.

The inclination angle $\theta 1$ connecting the inflection point P2 to the arbitrary point P3 of the end of the second surface hole V2 may be in the range of 20 to 70 degrees. When the inclination angle connecting the inflection point P2 to the arbitrary point P3 of the end of the second surface hole V2 is in the range of 20 to 70 degrees, uniformity of the deposition may be improved.

For example, the inclination angle connecting the inflection point P2 to the arbitrary point P3 of the end of the second surface hole V2 may be in the range of 30 to 60 degrees. For example, the inclination angle connecting the inflection point P2 to the arbitrary point P3 of the end of the second surface hole V2 may be in the range of 32 to 38 degrees or 52 to 58 degrees.

An inclination angle between an arbitrary point P1 of an end of the first surface hole V1 and an arbitrary point P3 of an end of the second surface hole V2 may be 70 degrees or less. For example, the inclination angle between the arbitrary point P1 of the end of the first surface hole V1 and the arbitrary point P3 of the end of the second surface hole V2 may be 60 degrees or less. For example, the inclination angle between the arbitrary point P1 of then end of the first surface hole V1 and the arbitrary point P3 of the end of the second surface hole V2 may be 50 degrees or less. Accordingly, it is possible to have an inclination angle capable of accommodating a deposition material well.

An inclination angle θ2 of a deposition mask connecting the inflection point P2 to an arbitrary point P1 of an end of the first surface hole V1 may be 90 degrees or less. That is, a width of the connecting part is greater than a width of the first surface hole, and thus the shadow region SA may not be included.

This may be different according to a deposition method. In the case of FIG. 22, a deposition angle from a deposition source material for deposition at the time of deposition to the point P1 is large, and thus it is easy when a deposition material may be attached to the point P1, and in the case of the embodiment of FIG. 31, a deposition source material has a low adhesion force to a metal substrate, and thus it is easy when the deposition material is not attached to the metal substrate at the point P1.

An angle to the inflection point with respect to the second surface and an angle to the first surface hole with respect to the inflection point may be 90 degrees or less, respectively. At this time, the angle to the inflection point with respect to the second surface may be smaller than the angle to the first surface hole with respect to the inflection point. That is, the inclination angle θ2 of a deposition mask connecting the inflection point P2 to the arbitrary point P1 of the end of the first surface hole V1 is greater than the inclination angle θ1 connecting the inflection point P2 to an arbitrary point P3 of an end of the second surface hole V2.

As an example, the metal surface layer may include at least one element selected from Ni, Cr, Fe, Au, Mo, O and Ti. For example, in the metal plate of the deposition mask according to the embodiment, the etch rate on the surface may be decreased by forming a Cr-containing surface layer on an Invar metal plate or forming an O-containing surface layer, so that the inclination angle between the inflection point and the first surface hole may be formed to 90 degrees or less.

A width of the second surface hole may be greater than a width of the inflection point and the width of the inflection point may be greater than the width of the first surface hole. Alternatively, the width of the second surface hole may be greater than the width of the inflection point, and the width of the inflection point may correspond to the width of the first surface hole. For example, the width of the first surface hole and the width of the inflection point may be in a ratio of 0.5:1 to 1:1.

Accordingly, it is possible to prevent a phenomenon of spreading of a deposition pattern released through the first surface hole.

The deposition mask according to the embodiment may provide a display device with high definition and/or ultra high definition by corresponding the width of the connecting part to the width of the deposition pattern or forming the width of the connecting part to be greater than that of the deposition pattern. The deposition mask according to the embodiment may have a resolution of 800 PPI or more.

The embodiment may not include the first surface hole.

Referring to FIG. 32, a second surface layer 120 may be included only on one surface of the base metal plate 100a when etching is performed only on one surface of a metal plate for a deposition mask. Accordingly, in an embodiment, it is possible to form a through-hole including only a second surface hole. The second surface hole may be in a shape capable of accommodating a deposition material and an organic material may be deposited in a width corresponding to an end of the second surface hole, and thus it is possible to prevent a diffusion phenomenon of the deposition material depending on a thickness of a first surface hole. Accordingly, the deposition mask according to the embodiment may improve deposition efficiency.

Therefore, the deposition mask according to the embodiment may manufacture a display device with high definition.

Hereinafter, the present invention will be explained in more detail through Exemplary Embodiments and Comparative Examples. Such an embodiment is merely presented as an example to explain the present invention in more detail. Therefore, the present invention is not limited to such an embodiment.

In Comparative Example 1, a photoresist layer was disposed on a 30 µm metal plate for a base deposition mask, and a through-hole was formed by wet etching.

In Comparative Example 2, a photoresist layer was disposed on a base metal plate thinned to a thickness of 20 µm or less by etching the 30 µm metal plate for the base deposition mask of Comparative Example 1, and a through-hole was formed by wet etching.

In Exemplary Embodiment 1, a Ni metal surface layer was formed on the base metal plate of Comparative Example 2. A photoresist layer was disposed on the metal surface layer containing Ni, and a through-hole was formed by wet etching.

In Exemplary Embodiment 2, a Cr and Ni metal surface layer was formed on the base metal plate of Comparative Example 2. A photoresist layer was disposed on a metal surface layer containing a binary alloy of Cr and Ni, and a through-hole was formed by wet etching.

In Exemplary Embodiment 3, a Fe and Ni metal surface layer was formed on the base metal plate of Comparative Example 2. A photoresist layer was disposed on a metal surface layer containing a binary alloy of Fe and Ni, and a through-hole was formed by wet etching.

As described above, the surface layer may be removed after forming a through-hole by wet etching.

An etching factor was measured under the same conditions for a width of the open region of the photoresist layer of Comparative Examples and Exemplary Embodiments, a temperature of an etchant and a type of the etchant.

Experimental Example 1: Evaluation of adhesion force of photoresist layer, etching factor, and through-hole quality

TABLE 2

| | Comparative Example 1 | Comparative Example 2 | Exemplary Embodiment 1 | Exemplary Embodiment 2 | Exemplary Embodiment 3 |
|---|---|---|---|---|---|
| Adhesion force of photoresist layer | ○ | ○ | ○ | ○ | ○ |
| Etching factor | 1.0 | 1.15 | 3.0 | 3.2 | 2.8 |

TABLE 2-continued

|  | Comparative Example 1 | Comparative Example 2 | Exemplary Embodiment 1 | Exemplary Embodiment 2 | Exemplary Embodiment 3 |
|---|---|---|---|---|---|
| Through-hole quality | X | X | ○ | ○ | ○ |

Table 2 shows evaluation results of an adhesion force of a photoresist layer, an etching factor and through hole quality of Exemplary Embodiments and Comparative Examples.

When de-filming of the photoresist layer does not occur, it was indicated by ○.

When a size deviation between the maximum value and the minimum value of diameters of through-holes is within ±3 μm, it was indicated by ○. Specifically, when a size deviation of holes adjacent to a reference hole is within ±3 μm, it was indicated by ○.

Referring to Table 2, it is confirmed that the metal surface layers of Exemplary Embodiments 1 to 3 include at least one element selected from Ni, Cr and Fe, thereby improving an etching factor to 1.2 or more. It can be confirmed that the etching factor of the metal surface layers in Exemplary Embodiments 1 to 3 is improved to 1.5 or more. It can be confirmed that the etching factor of the metal surface layers in Exemplary Embodiments 1 to 3 is improved to 1.6 or more. It can be confirmed that the etching factor of the metal surface layers in Exemplary Embodiments 1 to 3 is improved to 2.0 or more. It can be confirmed that the etching factor of the metal surface layers of Exemplary Embodiments 1 to 3 is increased to 2.8 or more by including a nickel layer or a binary alloy containing nickel. Accordingly, the deposition mask according to the embodiment may reduce a distance (pitch) of through-holes. In addition, the deposition mask according to the embodiment may form a fine sized through-hole to have excellent quality, and an OLED panel with ultra high definition may be manufactured through the same.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

The above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

The invention claimed is:

1. A deposition mask including a metal plate used for manufacturing the deposition mask, the metal plate comprising:
   a base metal plate;
   a first surface layer disposed on a first surface of the base metal plate; and
   a second surface layer disposed on a second surface facing the first surface of the base metal plate,
   wherein the first surface layer and the second surface layer include elements different from that of the base metal plate or composition ratios different from that of the base metal plate,
   wherein the base metal plate includes invar,
   wherein the base metal plate for the deposition mask includes a deposition pattern region and a non-deposition region, and the deposition pattern region includes a plurality of through-holes, and
   the deposition pattern region is divided into an effective region, an outer region, and an ineffective region, and a through-hole is formed in the effective region and the outer region,
   a shape of the through-hole of the outer region is different from a shape of the through-hole of the effective region.

2. The deposition mask of claim 1, wherein a thickness of the metal plate is 5 to 50 μm.

3. The deposition mask of claim 1, wherein a thickness of the base metal plate is 15 to 30 μm.

4. The deposition mask of claim 1, wherein a thickness of the first surface layer is more than 5 nm and 850 nm or less, and
   a thickness of the second surface layer is more than 30 nm and less than 500 nm.

5. The deposition mask of claim 1, wherein an arithmetic mean roughness (Ra) of the base metal plate measured at an interface between the base metal plate and at least one surface layer of the first surface layer and the second surface layer is more than 50 nm, and a ten-point mean roughness (Rz) is more than 800 nm.

6. The deposition mask of claim 1, wherein the first surface layer and the second surface layer include at least one metal of Ni, Cr, Fe, Ti, Mn, O, Mo, Ag, Zn, N, Al and alloys thereof.

7. The deposition mask of claim 6, wherein a ratio of Cr of the first surface layer and the second surface layer is 0.01 wt % to 24 wt %.

8. The deposition mask of claim 1, wherein the first surface layer and the second surface layer include at least two or more of Ni, Cr, Mo, Mn, Ti, Co, Cu, Fe, Au, Al, Mg, O, Ca, Cr, Si, Ti, Ag, Nb, V, In, and Sb.

9. The deposition mask of claim 1, wherein an etch rate of the base metal plate is greater than those of the first surface layer and the second surface layer.

10. The deposition mask of claim 1, wherein the first surface layer and the second surface layer include different elements not included in the base metal plate.

11. The deposition mask of claim 6, wherein the first surface layer and the second surface layer each is an alloy layer including 0.5 to 10 wt % Ti.

12. The deposition mask of claim 1, wherein the base metal plate includes a central region including a plurality of through-holes and an outer region positioned at an outer boundary of the central region,
   wherein a thickness of the first surface layer disposed at the central region correspond to a thickness of the first surface layer disposed at the outer region, and a thickness of the second surface layer disposed at the central region may correspond to a thickness of the second surface layer disposed at the outer region.

13. The deposition mask of claim 1, comprising
   a first surface hole and a second surface hole passing through the base metal plate, the first surface layer, and the second surface layer, and communicating with each other.

14. The deposition mask of claim 1, wherein the shape of the through-hole at a corner portion of the outer region is different from the shape of the through-hole of the effective region.

15. The deposition mask of claim 1, wherein the deposition mask includes a bridge region between through-holes, and the first surface layer and the second surface layer are disposed on the bridge region.

16. The deposition mask of claim 1, wherein the ineffective region includes a half etching portion.

* * * * *